US012672345B2

(12) United States Patent (10) Patent No.: US 12,672,345 B2

Huang et al. (45) Date of Patent: Jun. 30, 2026

(54) SEMICONDUCTOR DEVICE AND METHOD FOR FORMING THE SAME

(71) Applicants: TAIWAN SEMICONDUCTOR MANUFACTURING COMPANY, LTD., Hsinchu (TW); National Yang Ming Chiao Tung University, Hsinchu City (TW)

(72) Inventors: Bo-Wei Huang, New Taipei City (TW); Chien-Te Tu, Hsinchu City (TW); Chee-Wee Liu, Taipei City (TW)

(73) Assignees: TAIWAN SEMICONDUCTOR MANUFACTURING COMPANY, LTD., Hsinchu (TW); NATIONAL YANG MING CHIAO TUNG UNIVERSITY, Hsinchu City (TW)

( * ) Notice: Subject to any disclaimer, the term of this patent is extended or adjusted under 35 U.S.C. 154(b) by 297 days.

(21) Appl. No.: 18/518,766

(22) Filed: Nov. 24, 2023

(65) Prior Publication Data

US 2025/0176254 A1     May 29, 2025

(51) Int. Cl.
H10D 84/83     (2025.01)
H10D 30/43     (2025.01)
(Continued)

(52) U.S. Cl.
CPC ............. H10D 84/83 (2025.01); H10D 30/43 (2025.01); H10D 30/6735 (2025.01);
(Continued)

(58) Field of Classification Search
CPC ............. H10D 64/257; H10D 30/6757; H10D 64/518; H10D 84/0186; H10D 84/0188;
(Continued)

(56) References Cited

U.S. PATENT DOCUMENTS 9,209,247 B2     12/2015   Colinge et al.
9,236,267 B2     1/2016   De et al.
(Continued)

FOREIGN PATENT DOCUMENTS

TW        202341482 A     10/2023

OTHER PUBLICATIONS

Chehab et al., "Design-Technology Co-Optimization of Sequential and Monolithic CFET as enabler of technology node beyond 2nm", Proceedings of SPIE, Design-Process-Technology Co-optimization XV, vol. 11614, 2021, pp. 116140D-1-116140D-5.
(Continued)

*Primary Examiner* — Fernando L Toledo
*Assistant Examiner* — Adam S Bowen
(74) *Attorney, Agent, or Firm* — Birch, Stewart, Kolasch & Birch, LLP

(57)            ABSTRACT

A semiconductor device includes a first transistor, a second transistor above the first transistor, and an isolation structure. The first transistor includes a first semiconductor channel layer, a first gate structure wrapping around the first semiconductor channel layer, and first source/drain epitaxy structures on opposite ends of the first semiconductor channel layer. The second transistor includes a second semiconductor channel layer, a second gate structure wrapping around the second semiconductor channel layer, and second source/drain epitaxy structures on opposite ends of the second semiconductor channel layer. The isolation structure electrically isolates the first gate structure from the second gate structure, wherein in a top view the isolation structure is adjacent to the second gate structure, and wherein in a first cross-sectional view, the isolation structure wraps around the first semiconductor channel layer.

20 Claims, 47 Drawing Sheets

(51) Int. Cl.

| | |
|---|---|
| *H10D 30/67* | (2025.01) |
| *H10D 62/10* | (2025.01) |
| *H10D 64/23* | (2025.01) |
| *H10W 10/00* | (2026.01) |
| *H10W 10/10* | (2026.01) |

(52) U.S. Cl.

CPC ......... *H10D 62/121* (2025.01); *H10D 64/257* (2025.01); *H10W 10/011* (2026.01); *H10W 10/10* (2026.01)

(58) Field of Classification Search

CPC ... H10D 84/85; H10D 84/038; H10W 10/011; H10W 10/10

See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2021/0320035 | A1* | 10/2021 | Xie ........................ H10D 84/85 |
| 2023/0144607 | A1 | 5/2023 | Yeoh et al. |
| 2023/0299086 | A1* | 9/2023 | Yu .......................... H10D 30/43 |

OTHER PUBLICATIONS

Huang et al., "3-D Self-aligned Stacked NMOS-on-PMOS Nanoribbon Transistors for Continued Moore's Law Scaling", 2020 IEEE International Electron Devices Meeting (IEDM), 2020, pp. 20.6.1-20.6.4.

Subramanian et al., "First Monolithic Integration of 3D Complementary FET (CFET) on 300mm Wafers", 2020 Symposium on VLSI Technology Digest of Technical Papers, 2020, pp. 1-2.

\* cited by examiner 132
130
128
125
120
106
100P
100

152
150
140
115
132

129

130

117
128
120

MA1
104

145
142

102

106
100P
100

A
160

140 132

145

152 150

115
A

SEMICONDUCTOR DEVICE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
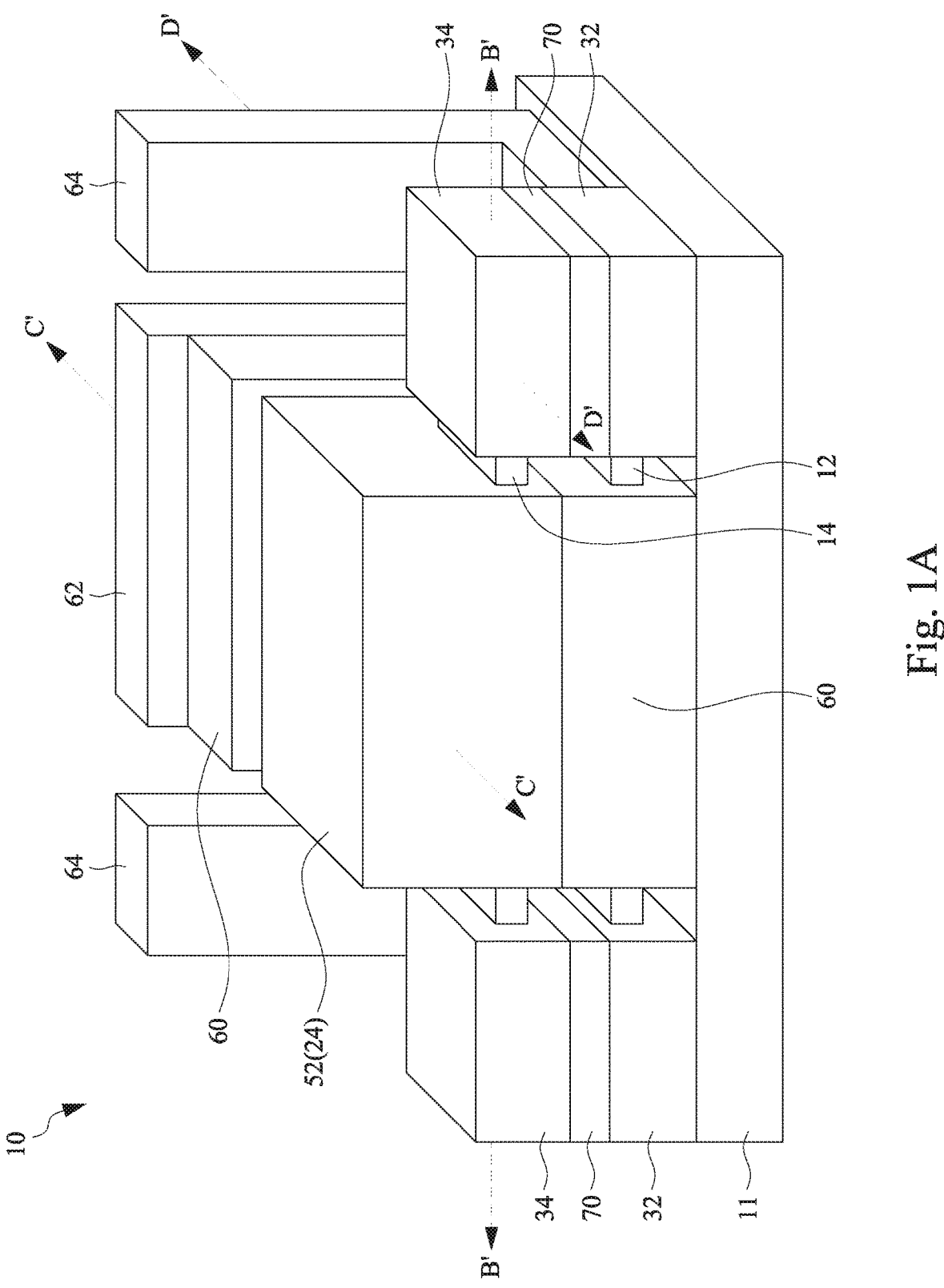
FIG. 1A is a perspective view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated. One skilled in the art will realize, however, that the values or ranges recited throughout the description are merely examples, and may be reduced or varied with the downscaling of the integrated circuits.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1B:
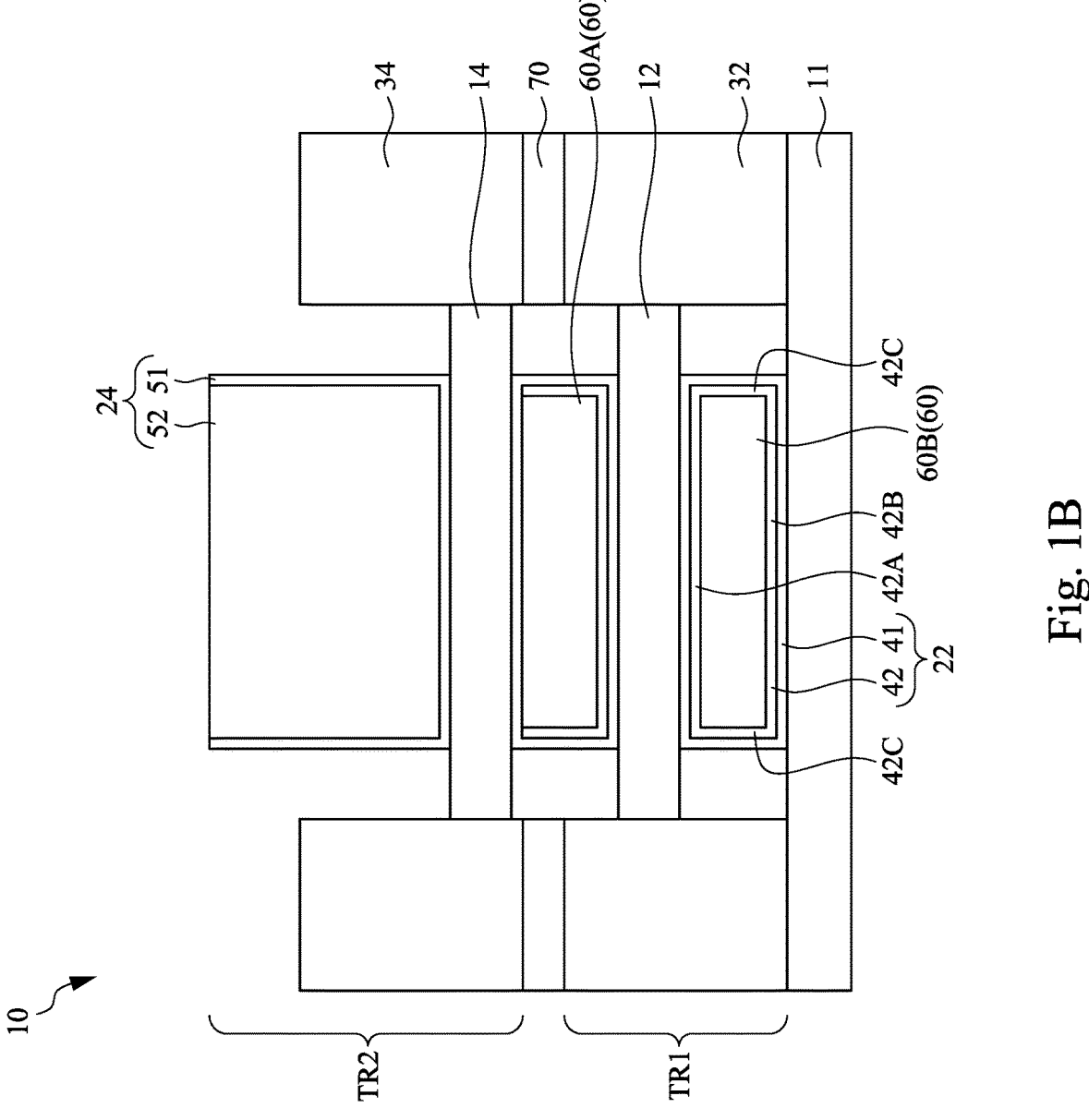
FIGS. 1B to 1D are cross-sectional views of a semiconductor device in accordance with some embodiments of the present disclosure.
Figure 1D:
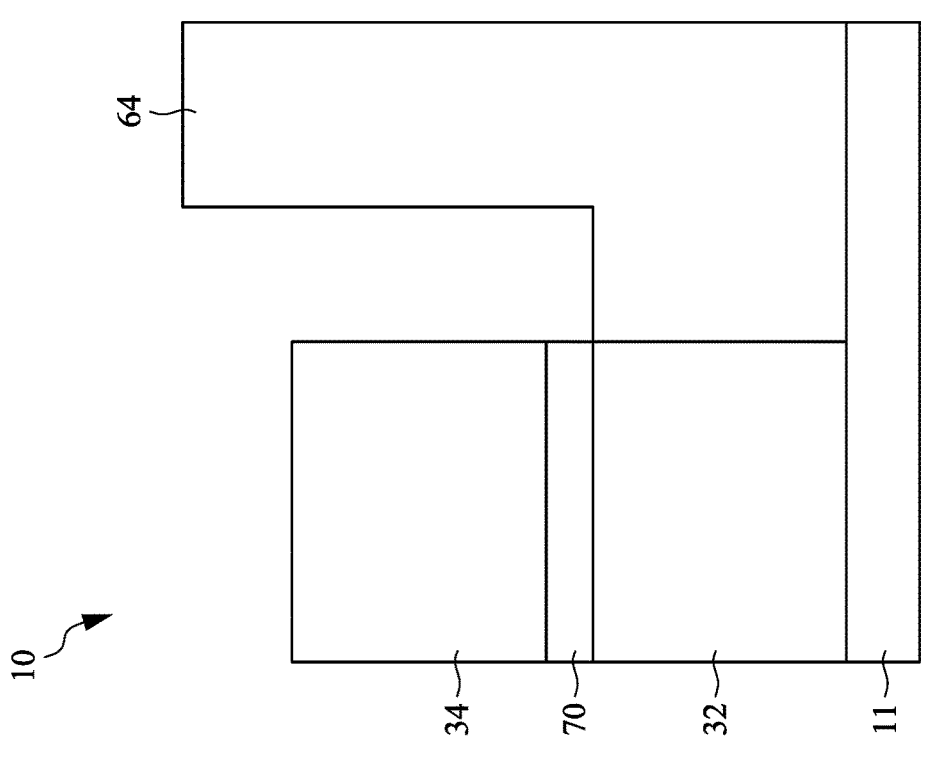
Figure 1C:
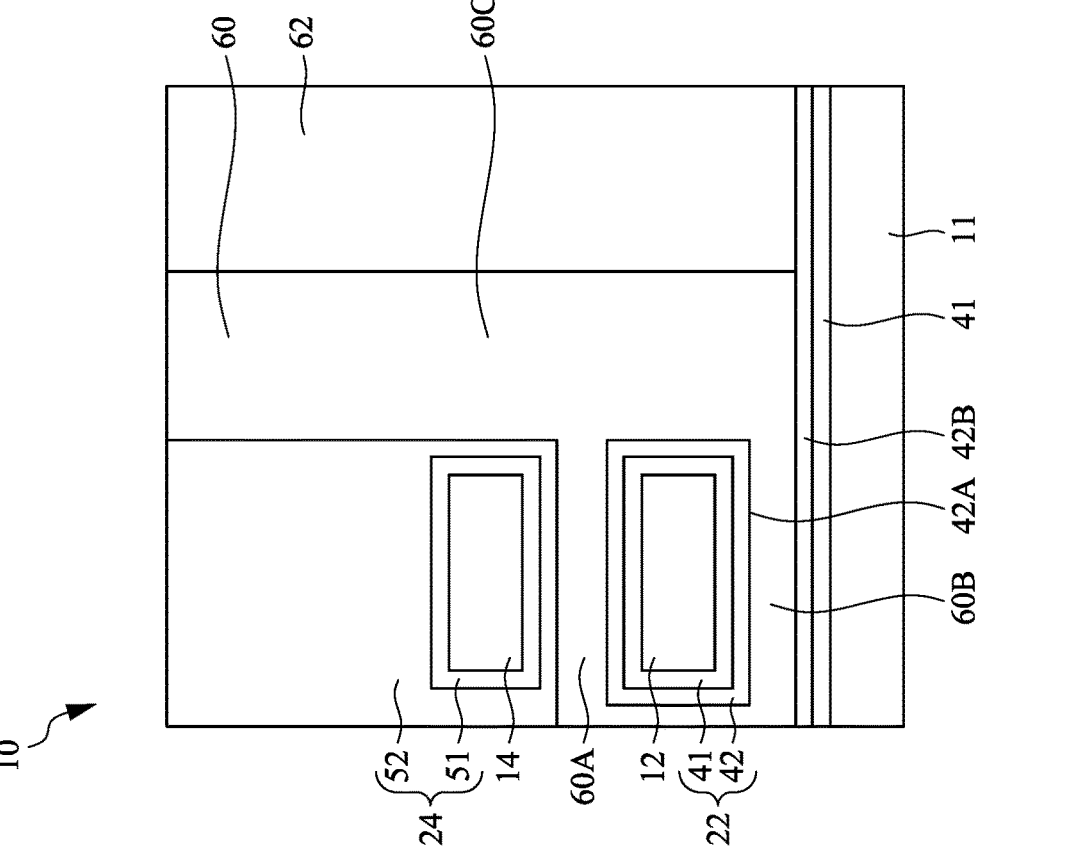

FIG. 1A is a perspective view of a semiconductor device in accordance with some embodiments of the present disclosure. FIGS. 1B to 1D are cross-sectional views of a semiconductor device in accordance with some embodiments of the present disclosure. In greater detail, FIGS. 1B, 1C, and 1D are cross-sectional views along lines B'-B', C'-C', and D'-D' of FIG. 1A, respectively.

In the present disclosure, a complementary FET (CFET) 10 is provided, and its manufacturing method will be disclosed in the following discussion. In a CFET 10, a first transistor TR1 is disposed over a substrate 11, and a second transistor TR2 is disposed vertically above the first transistor TR1 (see FIG. 1B). In some embodiments, the first transistor TR1 and the second transistor TR2 may be field effect transistor (FET) and may both include gate-all-around (GAA) configuration, and thus the first transistor TR1 and the second transistor TR2 can also be referred to as GAA FET. The first transistor TR1 includes a first semiconductor channel layer 12, a first metal gate structure 22 wrapping around the first semiconductor channel layer 12, and first source/drain epitaxy structures 32 on opposite ends of the first semiconductor channel layer 12. Similarly, the second transistor TR2 includes a second semiconductor channel layer 14, a second metal gate structure 24 wrapping around the second semiconductor channel layer 14, and second source/drain epitaxy structures 34 on opposite ends of the second semiconductor channel layer 14. The first metal gate structure 22 may include a gate dielectric layer 41 and a gate electrode 42. Similarly, the second metal gate structure 24 may include a gate dielectric layer 51 and a gate electrode 52. In some embodiments, the first transistor TR1 has a first conductivity type (e.g., p-type) and the second transistor TR2 has a second conductivity type (e.g., n-type) different from the first conductivity type. In some embodiments, the first transistor TR1 can be referred to as a P-FET, and the second transistor TR2 can be referred to as an N-FET. In other embodiments, the first transistor TR1 has a second conductivity type (e.g., n-type) and the second transistor TR2 has a first conductivity type (e.g., p-type). In some embodiments, the first transistor TR1 can be referred to as an N-FET, and the second transistor TR2 can be referred to as a P-FET.

As shown in FIGS. 1A, 1B, and 1C, the CFET 10 further includes an isolation structure 60 electrically isolating the first metal gate structure 22 from the second metal gate structure 24. As shown in the cross-sectional view of FIG. 1C, the isolation structure 60 has a portion 60A vertically between the gate electrode 42 of the first metal gate structure 22 and the gate electrode 52 of the second metal gate structure 24. The isolation structure 60 also wraps around the first semiconductor channel layer 12 in the cross-sectional view of FIG. 1C. As shown in FIGS. 1B and 1C, the isolation structure 60 also includes a portion 60B vertically between the first semiconductor channel layer 12 and the substrate 11. As shown in FIG. 1C, the isolation structure 60 also includes a portion 60C in contact with sidewalls of the first metal gate structure 22 and the second metal gate structure 24.

As shown in FIGS. 1A, 1B, and 1C, the CFET 10 further includes a bottom gate contact 62 electrically connected to the first metal gate structure 22 at a lower level of the CFET 10. Here, the term "bottom gate contact" may be referred to as a gate contact that is in contact with the gate structure at a lower level (e.g., the first metal gate structure 22). In some embodiments, the bottom gate contact 62 may be in contact with a portion of the gate electrode 42 of the first metal gate structure 22. In greater detail, as shown in FIG. 1B, the gate electrode 42 of the first metal gate structure 22 may wrap around the portion 60B of the isolation structure 60. For example, in FIG. 1B, the gate electrode 42 of the first metal gate structure 22 may include a portion 42A in contact with top surface of the portion 60B of the isolation structure 60, a portion 42B in contact with bottom surface of the portion 60B of the isolation structure 60, and two portions 42C that connect the portions 42A and 42B with each other. That is, the portions 42A, 42B, and 42C may form a rectangular ring-shape structure that wraps around the portion 60B of the isolation structure 60. Similarly, the gate dielectric layer 41 also includes a rectangular ring-shape structure that wraps around the portion 60B of the isolation structure 60. Stated another way, the first metal gate structure 22 also wrap around the portion 60B of the isolation structure 60.

On the other hand, as shown in FIG. 1C, the portion 42B of the gate electrode 42 may extend to bottom surface of the bottom gate contact 62. In greater detail, the portion 42B of the gate electrode 42 is in contact with and is electrically connected to the bottom surface of the bottom gate contact 62. As a result, the portions 42A and 42C of the gate electrode 42 may also be electrically connected to the bottom gate contact 62. In some embodiments, the gate dielectric layer 41 has a portion vertically between the portion 42B of the gate electrode 42 and the substrate 11. Moreover, the portion of the gate dielectric layer 41 also extends to a position that is vertically between the bottom surface of the bottom gate contact 62 and the substrate 11.

As shown in FIGS. 1A, 1B, and 1D, the CFET 10 further includes bottom source/drain contacts 64 in contact with and electrically connected to the respective first source/drain epitaxy structures 32. Here, the term "bottom source/drain contact" may be referred to as a source/drain contact that is in contact with the source/drain epitaxy structure at a lower level (e.g., the first source/drain epitaxy structure 32). The CFET 10 further includes isolation structures 70, in which each of the isolation structures 70 is vertically between one of the first source/drain epitaxy structures 32 and a respective one of the second source/drain epitaxy structures 34. Accordingly, the first source/drain epitaxy structures 32 are electrically isolated from the respective second source/drain epitaxy structures 34 through the isolation structures 70.

As shown in FIG. 1D, the bottom source/drain contact 64 is in contact with sidewall of the first source/drain epitaxy structure 32, while top surface of the first source/drain epitaxy structure 32 is covered by the isolation structure 70. The bottom source/drain contact 64 is spaced apart from the second source/drain epitaxy structure 34. In some embodiments, the bottom source/drain contact 64 may include an L-shape cross-sectional view.

FIGS. 2A to 31D illustrate a method in various stages of forming a semiconductor device in accordance with some embodiments of the present disclosure. In greater detail, FIGS. 2A to 31D illustrate a method for forming a CFET that is similar to the CFET 10 as described in FIGS. 1A to 1D. Although FIGS. 2A to 31D are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 2B:
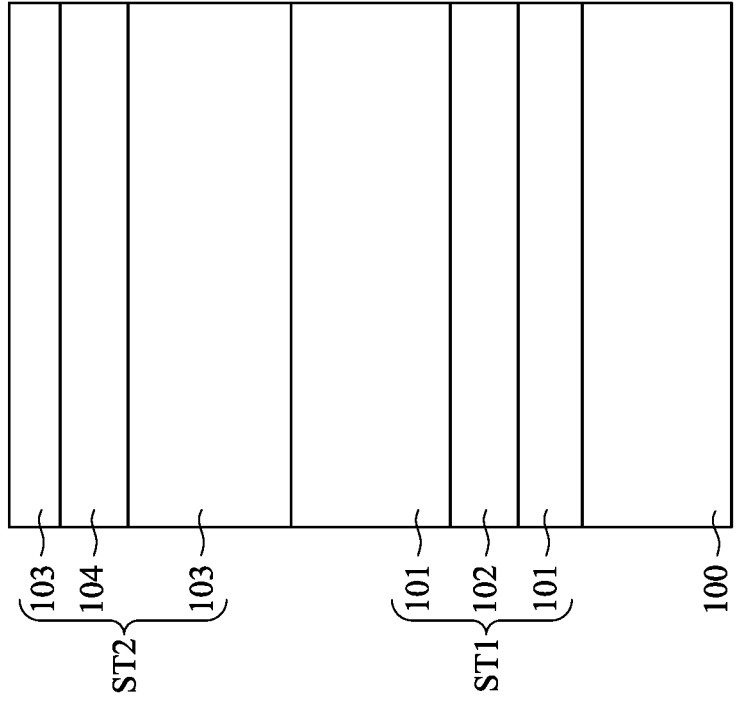
FIGS. 2A to 31D illustrate a method in various stages of forming a semiconductor device in accordance with some embodiments of the present disclosure.
Figure 2A:
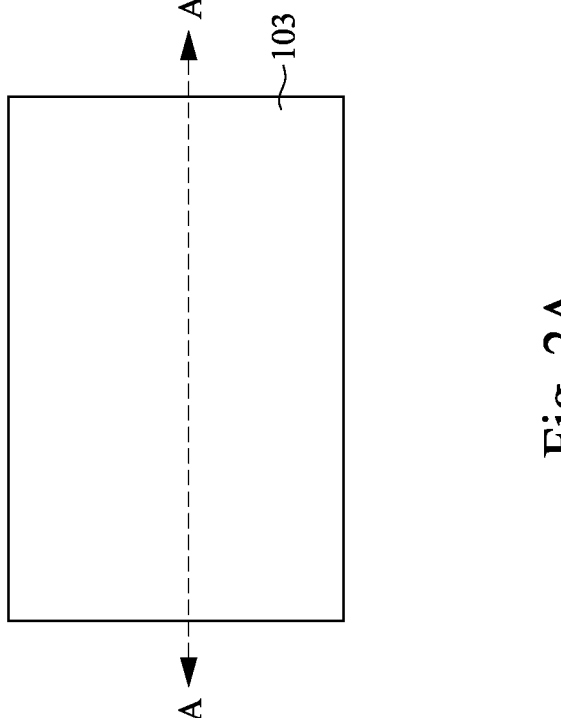

Reference is made to FIGS. 2A and 2B, in which FIG. 2A is a top view of a semiconductor device, and FIG. 2B is a cross-sectional view along line A-A of FIG. 2A. Shown there is a substrate 100. Generally, the substrate 100 may include a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally include the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

A stack ST1 of first sacrificial layers 101 and a first semiconductor layer 102 is formed over the substrate 100. Then, a stack ST2 of second sacrificial layers 103 and a second semiconductor layer 104 is formed over the stack ST1. In greater detail, the first semiconductor layer 102 is sandwiched between the first sacrificial layers 101, and the second semiconductor layer 104 is sandwiched between the second sacrificial layers 103. In some embodiments, the topmost first sacrificial layer 101 is in contact with the bottommost second sacrificial layer 103. In some embodiments, the first sacrificial layers 101, the first semiconductor layer 102, the second sacrificial layers 103, and the second semiconductor layer 104 may be formed using suitable deposition process, such as selective epitaxial growth (SEG), chemical vapor deposition (CVD), molecular beam epitaxy (MBE), or other suitable process(es). In some embodiments, the first sacrificial layers 101 and the second sacrificial layers 103 may include semiconductor material, and can also be referred to as semiconductor layers. In some embodiments, the first semiconductor layer 102 and the second semiconductor layer 104 each may serve as a channel layer of a transistor, and can also be referred to as a semiconductor channel layer.

In some embodiments, the first semiconductor layer 102 and the second semiconductor layer 104 may include silicon germanium (SiGe). For example, the first semiconductor layer 102 and the second semiconductor layer 104 may include $Si_{0.25}Ge_{0.75}$. The first sacrificial layers 101 and the second sacrificial layers 103 may include germanium (Ge). In some embodiments, the first sacrificial layers 101 and the second sacrificial layers 103 may be doped with different impurities to provide sufficient etching resistance. For example, the first sacrificial layers 101 may be germanium doped with phosphorous (Ge:P), and the second sacrificial layers 103 may be germanium doped with boron (Ge:B).

In other embodiments, the first semiconductor layer 102 and the second semiconductor layer 104 may include silicon (Si). The first sacrificial layers 101 and the second sacrificial layers 103 may include silicon germanium (SiGe). In some embodiments, the first sacrificial layers 101 and the second sacrificial layers 103 may be silicon germanium but with different germanium concentrations.

Although shown there is one first semiconductor layer 102 and one second semiconductor layer 104, while multiple first semiconductor layers 102 and multiple second semiconductor layers 104 may also be applied. For example, the stack ST1 may include alternating first sacrificial layers 101 and first semiconductor layers 102. Similarly, the stack ST2 may include alternating second sacrificial layers 103 and second semiconductor layers 104.

Figure 3B:
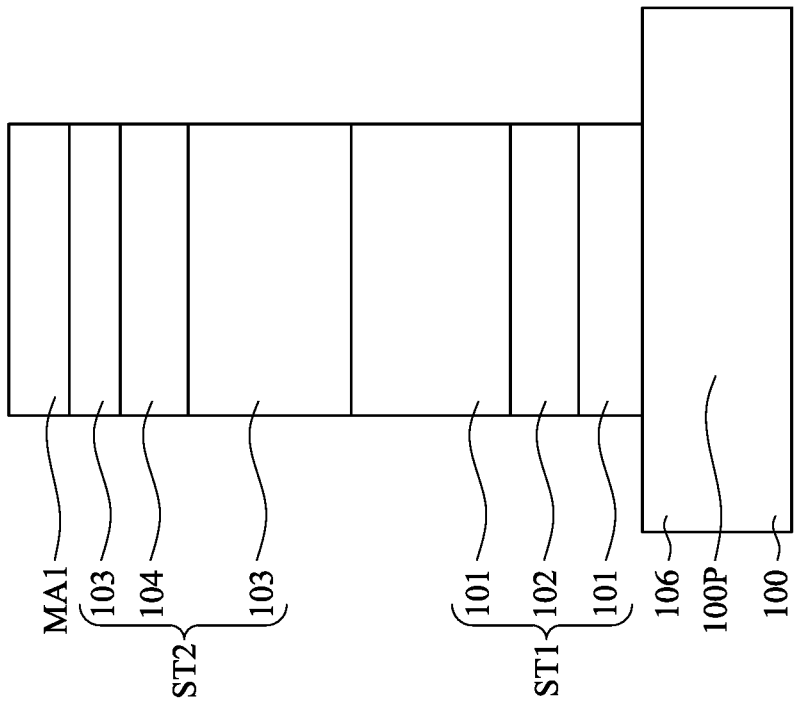
Figure 3A:
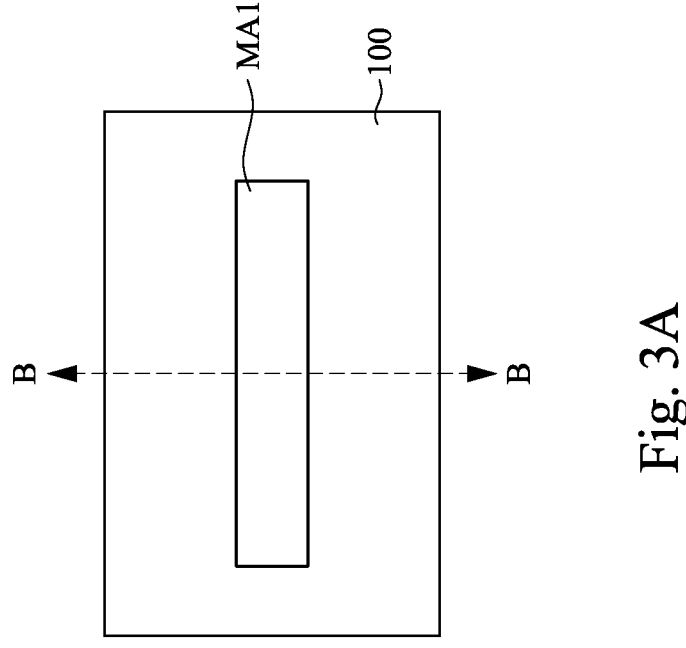

Reference is made to FIGS. 3A and 3B, in which FIG. 3A is a top view of a semiconductor device, and FIG. 3B is a cross-sectional view along line B-B of FIG. 3A. A patterned mask MA1 is formed over the substrate 100 and covering the stack ST2. In some embodiments, the patterned mask MA1 may be a hard mask, and may include dielectric material, such as silicon nitride (SiN), silicon oxide ($SiO_2$), combination thereof, or the like.

Afterwards, an etching process is performed by using the patterned mask MA1 as an etch mask, so as to remove portions of the stacks ST1 and ST2, and portions of the substrate 100 that are exposed through the patterned mask MA1 to form a fin structure. The fin structure may include remaining portions of the stacks ST1 and ST2 and a semiconductor strip 100P protruding over the substrate 100. In some embodiments, the etching process may include wet etch, dry etch, or the like. For example, the etching process may include anisotropic etch by using $Cl_2$-based reactive ion etching (RIE).

Figure 4B:
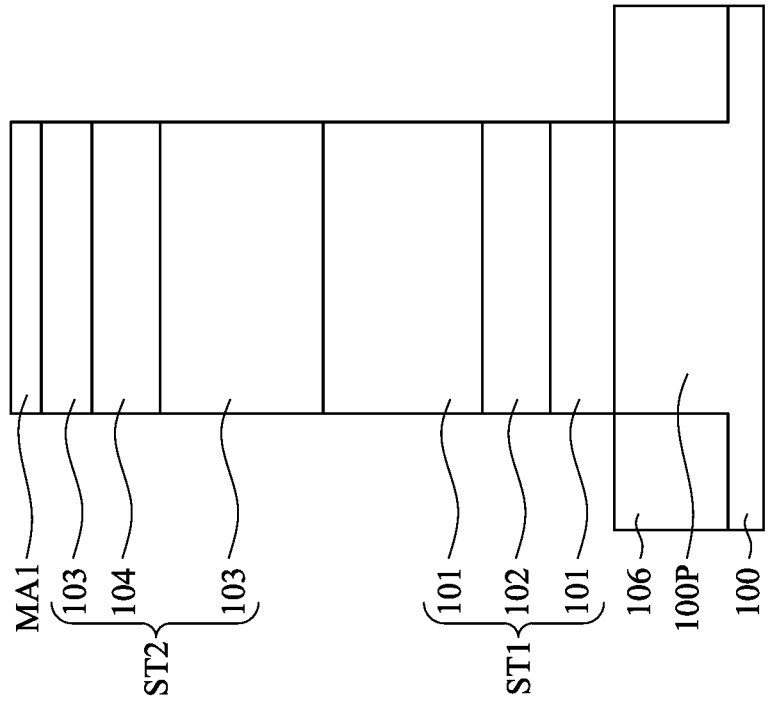
Figure 4A:
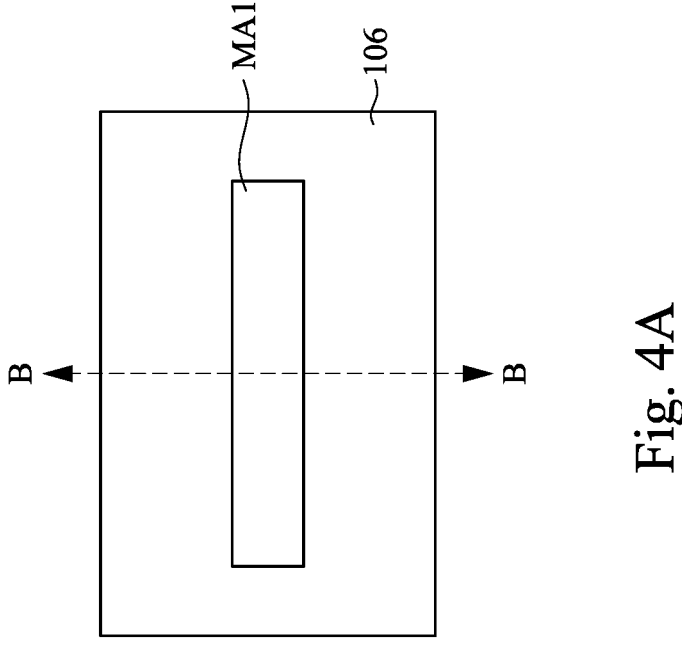

Reference is made to FIGS. 4A and 4B, in which FIG. 4A is a top view of a semiconductor device, and FIG. 4B is a cross-sectional view along line B-B of FIG. 4A. An isolation structures 106 is formed over the substrate 100 and laterally surrounding the fin structure. In some embodiments, the isolation structure 106 may be in contact with sidewalls of the semiconductor strip 100P of the substrate 100. The isolation structure 106 may be shallow trench isolation (STI) structures, suitable isolation structures, combinations of the foregoing, or the like. In some embodiments, the isolation structure 106 may be made of oxide (e.g., silicon oxide), nitride (e.g., silicon nitride), or combinations thereof. In some embodiments, the isolation structure 106 may be formed by, for example, depositing a dielectric material blanket over the substrate 100, performing a planarization process to the dielectric material, and then etching back the dielectric material to lower top surface of the dielectric material to a desired position.

Figure 5B:
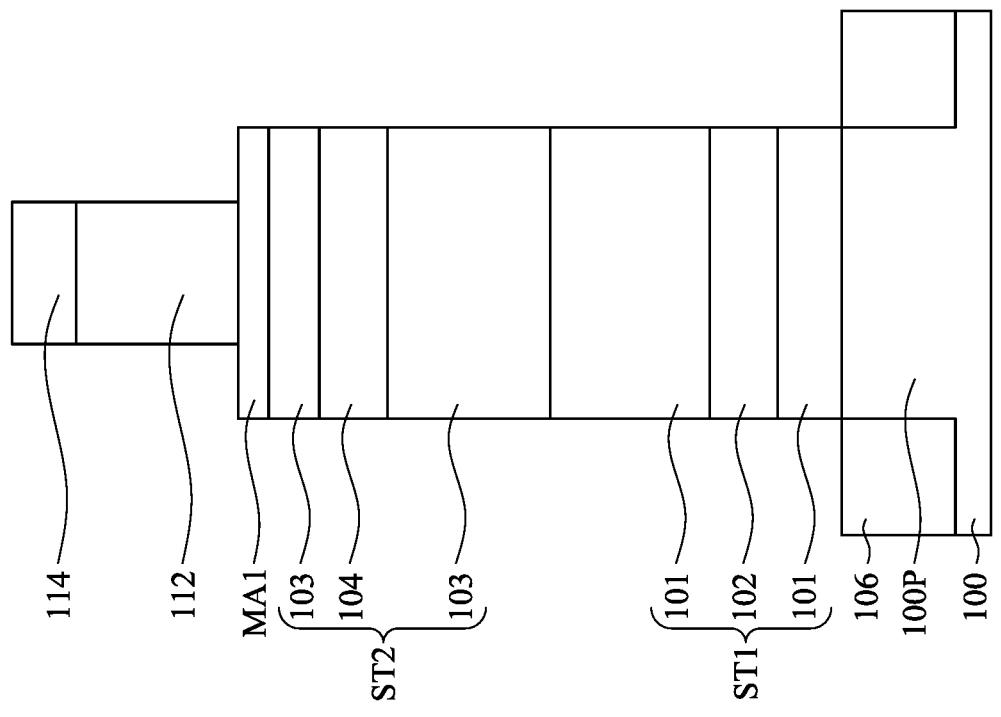
Figure 5A:
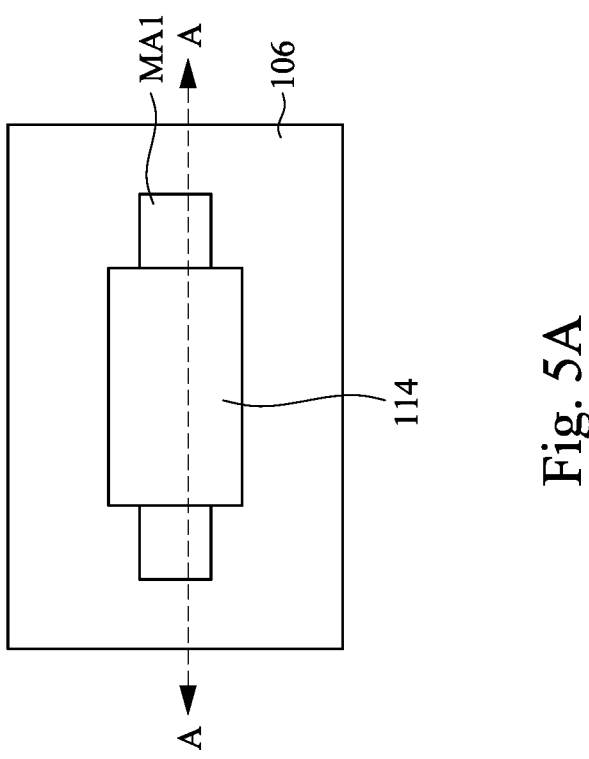

Reference is made to FIGS. 5A and 5B, in which FIG. 5A is a top view of a semiconductor device, and FIG. 5B is a cross-sectional view along line A-A of FIG. 5A. A dummy gate structure 112 is formed over the substrate 100 and crossing the fin structure. In greater detail, the dummy gate structure 112 may cross the stacks ST1 and ST2, and the semiconductor strip 100P. In some embodiments, the dummy gate structure 112 may be formed by, for example, depositing a dummy gate material blanket over the substrate 100, forming a dummy gate hard mask 114 over the dummy gate material, and then performing an etching process to remove portions of the dummy gate material exposed through the dummy gate hard mask 114. In some embodiments, the dummy gate structure 112 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. In some embodiments, the dummy gate hard mask 114 may include dielectric material, such as silicon oxycarbide (SiOC). In some embodiments, the dummy gate structure 112 may be deposited by physical vapor deposition (PVD), chemical vapor deposition (CVD), sputter deposition, or other techniques for depositing the selected material.

Figure 6B:
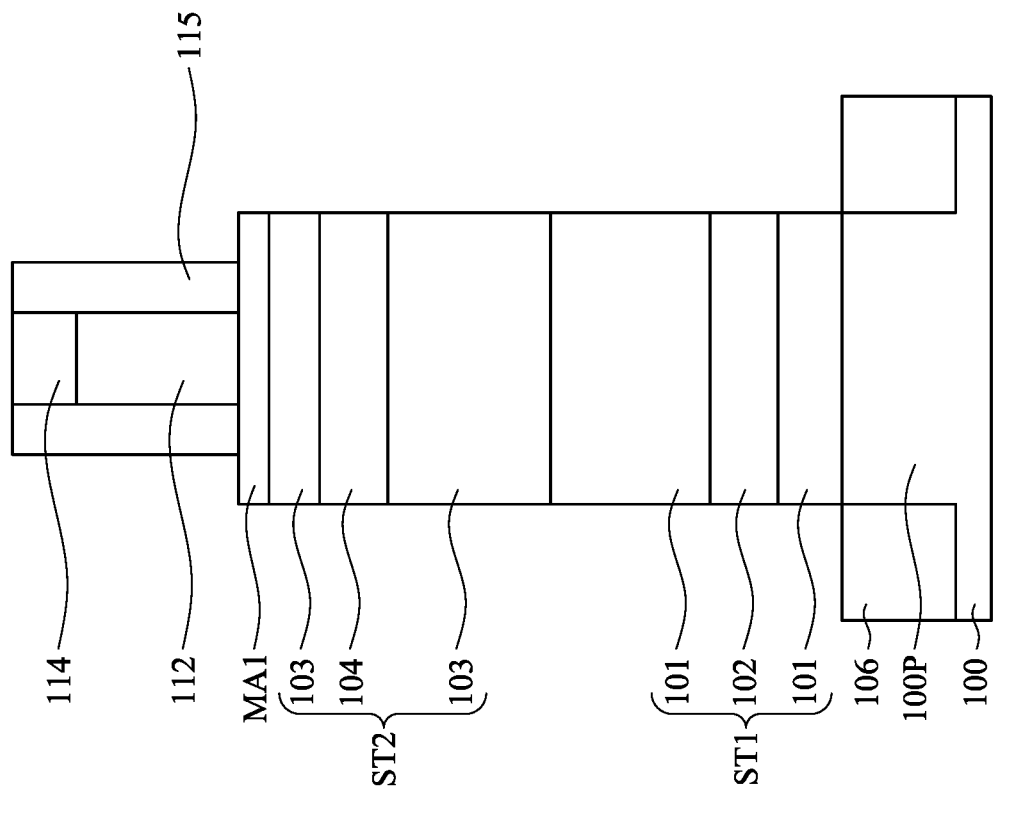
Figure 6A:
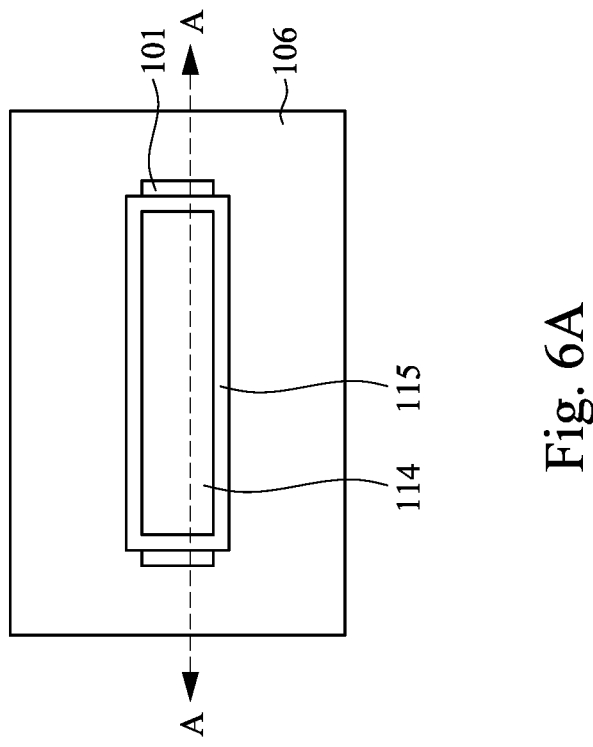

Reference is made to FIGS. 6A and 6B, in which FIG. 6A is a top view of a semiconductor device, and FIG. 6B is a cross-sectional view along line A-A of FIG. 6A. Gate spacers 115 are formed on opposite sidewalls of the dummy gate structure 112 and opposite sidewalls of the dummy gate hard mask 114. In some embodiments, the gate spacers 115 may be formed of silicon oxide, silicon nitride, silicon oxynitride, combinations thereof. In some embodiments, the gate spacers 115 may be formed by, for example, depositing a spacer layer blanket over the substrate 100, and then performing an anisotropic etching process to remove horizontal portions of the spacer layer, such that vertical portions of the spacer layer remain on sidewalls of the dummy gate structure 112. The spacer layer may be deposited using techniques such CVD, ALD, or the like.

Figures 7A, 7B:
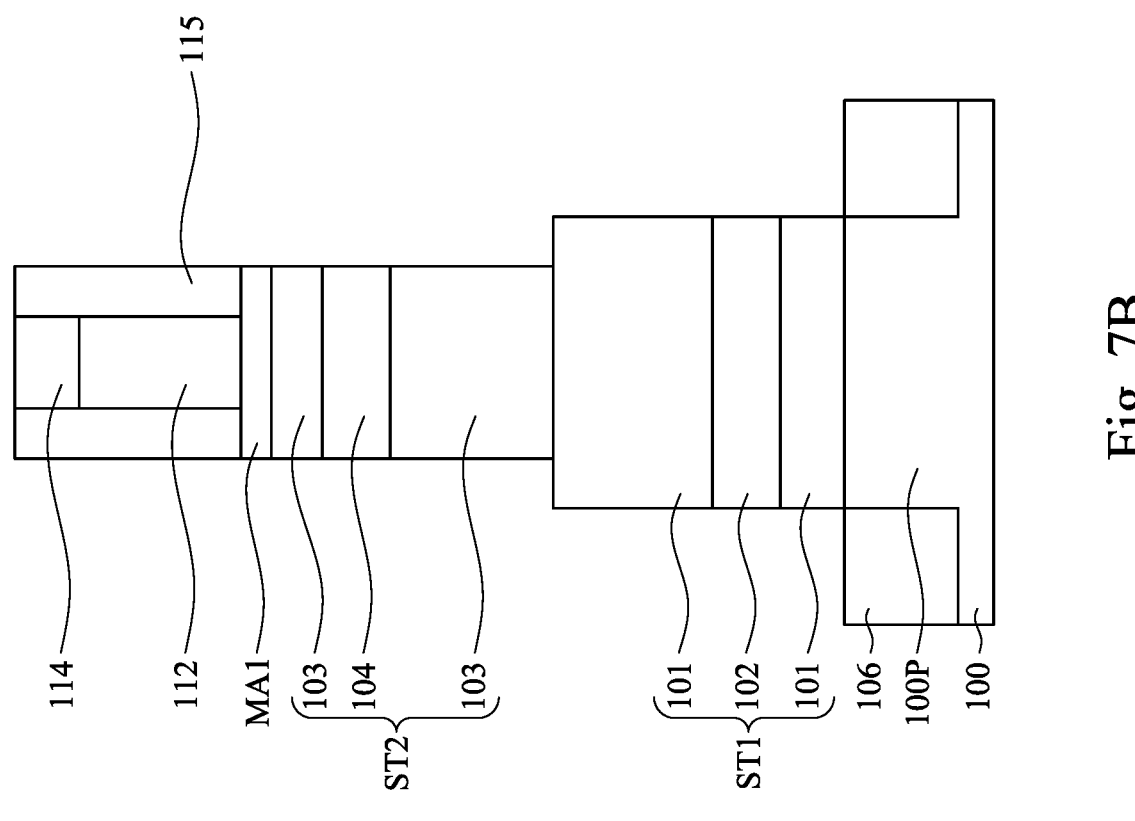

Reference is made to FIGS. 7A and 7B, in which FIG. 7A is a top view of a semiconductor device, and FIG. 7B is a cross-sectional view along line A-A of FIG. 7A. An etching process is performed using the gate spacers 115 and the dummy gate hard mask 114 (or the dummy gate structure 112) as an etch mask, so as to remove portions of the stack ST2 that are exposed through the gate spacers 115 and the dummy gate hard mask 114 (or the dummy gate structure 112). In greater detail, portions of the second sacrificial layers 103 and the second semiconductor layer 104 are removed during the etching process. In some embodiments, etching process may include anisotropic etch, such as RIE. In some embodiments, the first sacrificial layers 101 may include higher etching resistance to the etching process than the second sacrificial layers 103 and the second semiconductor layer 104, and thus the first sacrificial layers 101 may act as an etch stop layer during the etching process. As a result, the etching process may be stopped at the topmost first sacrificial layer 101. After the etching process is complete, portions of top surface of the topmost first sacrificial layer 101 may be exposed. In some embodiments, the second sacrificial layers 103 and the second semiconductor layer 104 may include narrower widths than the first sacrificial layers 101 and the first semiconductor layer 102 in the cross-sectional view of FIG. 7B.

Figure 8B:
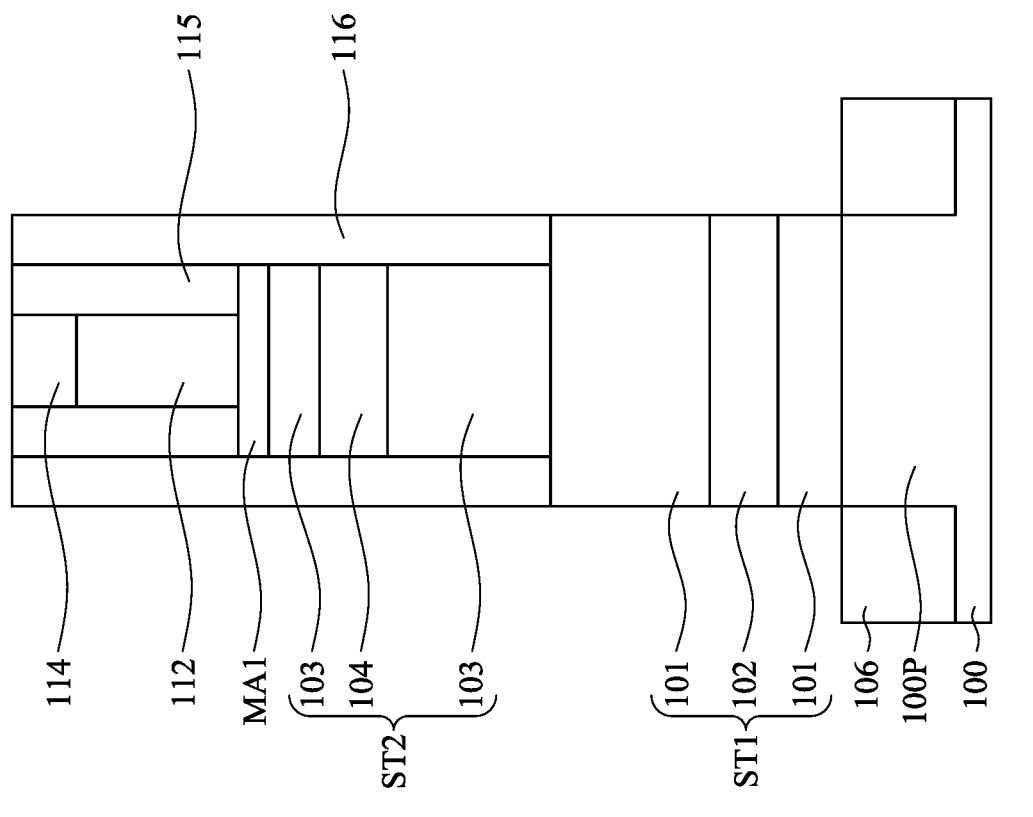
Figure 8A:
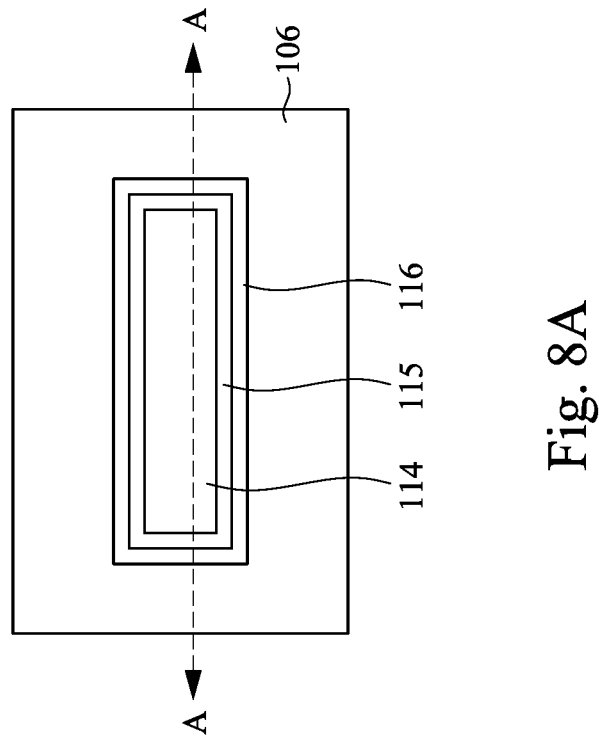

Reference is made to FIGS. 8A and 8B, in which FIG. 8A is a top view of a semiconductor device, and FIG. 8B is a cross-sectional view along line A-A of FIG. 8A. Spacers 116 are formed on opposite sidewalls of the stack ST2. In greater detail, the spacers 116 are formed covering sidewalls of the second sacrificial layers 103 and the second semiconductor layer 104. On the other hand, sidewalls of the stack ST1 may be exposed through the spacers 116. In greater detail, sidewalls of the first sacrificial layers 101 and the first semiconductor layer 102 are exposed through the spacers 116. In some embodiments, the spacers 116 may also extend to sidewalls of the gate spacers 115. In some embodiments, the spacers 116 may also be in contact with top surface of the topmost first sacrificial layer 101. In some embodiments, the spacers 116 may be formed of silicon oxide, silicon nitride, silicon oxynitride, combinations thereof. In some embodiments, the spacers 116 and the gate spacers 115 may include a same material. In some embodiments, the spacers 116 may be formed by, for example, depositing a spacer layer blanket over the substrate 100, and then performing an anisotropic etching process to remove horizontal portions of the spacer layer, such that vertical portions of the spacer layer remain on sidewalls of the stack ST2. The spacer layer may be deposited using techniques such CVD, ALD, or the like.

Figure 9B:
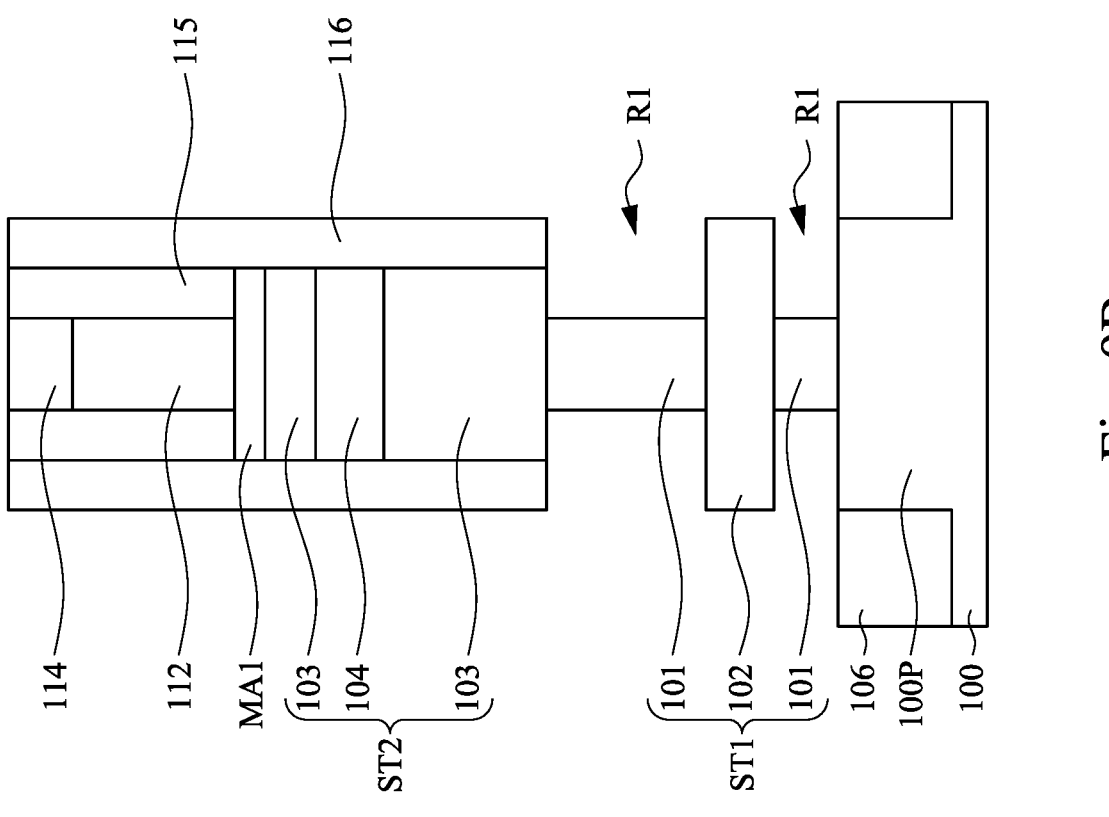
Figure 9A:
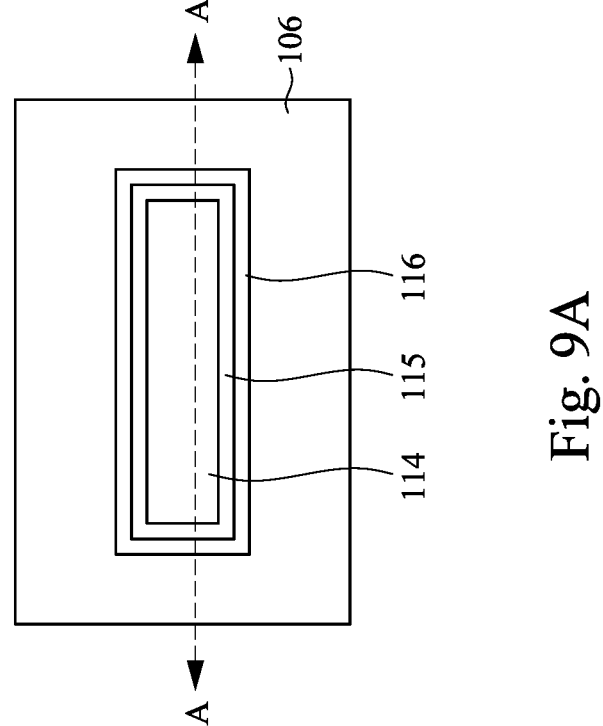

Reference is made to FIGS. 9A and 9B, in which FIG. 9A is a top view of a semiconductor device, and FIG. 9B is a cross-sectional view along line A-A of FIG. 9A. An etching process is performed to laterally etch sidewalls of the first sacrificial layers 101, so as to form sidewall recesses R1 on opposite ends of the etched first sacrificial layers. In some embodiments, the etching process may include wet etch, dry etch, or combinations thereof.

Figure 10B:
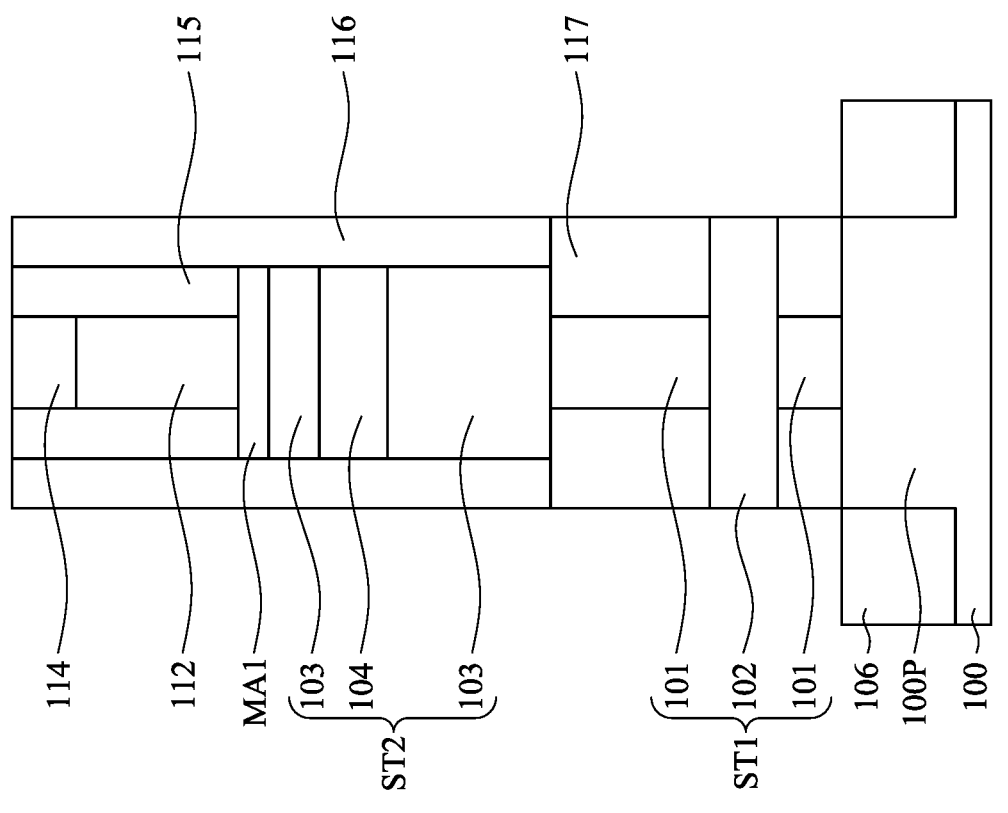
Figure 10A:
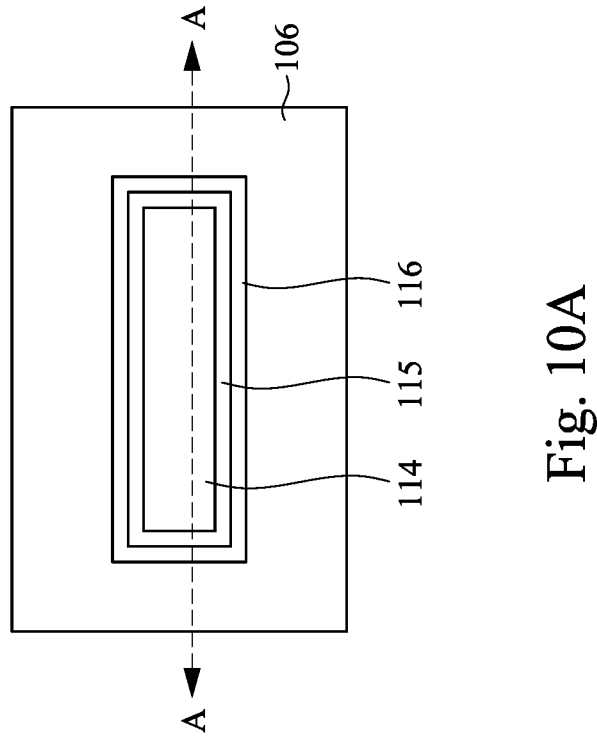

Reference is made to FIGS. 10A and 10B, in which FIG. 10A is a top view of a semiconductor device, and FIG. 10B is a cross-sectional view along line A-A of FIG. 10A. Inner spacers 117 are formed in the sidewall recesses R1. In some embodiments, the inner spacers 117 may be formed by, for example, depositing an inner spacer layer blanket over the substrate 100 and filling the sidewall recesses R1, and then performing an anisotropic etching to remove portions of the inner spacer layer outside the sidewall recesses, leaving the remaining portions of the inner spacer layer in the sidewall recesses R1 as the inner spacers 117. The inner spacers 117 may be deposited by a conformal deposition process, such as CVD, ALD, or the like. The inner spacer layer may include material such as SiN, SiOCN, SiCN, SIOC, or the like.

Figure 11B:
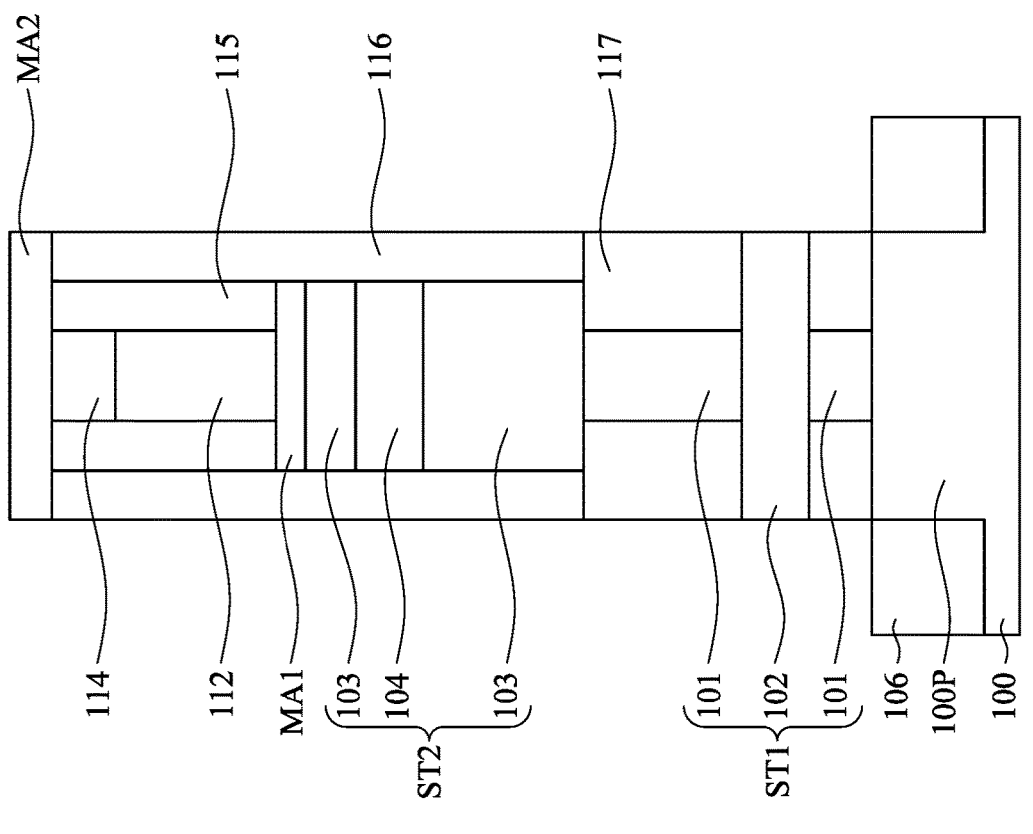
Figure 11A:
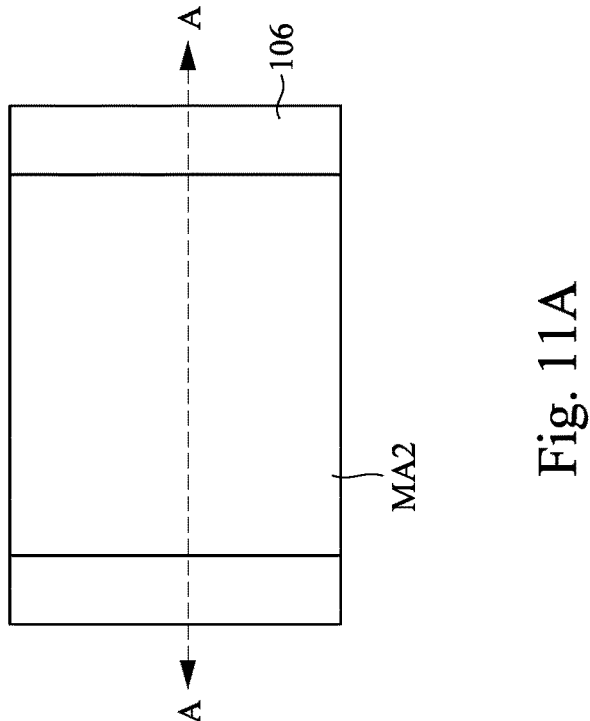

Reference is made to FIGS. 11A and 11B, in which FIG. 11A is a top view of a semiconductor device, and FIG. 11B is a cross-sectional view along line A-A of FIG. 11A. A patterned mask MA2 is formed over the substrate 100 and covering the dummy gate structure 112, the gate spacers 115, and the spacers 116. In some embodiments, the patterned mask MA2 may be a hard mask, and may include dielectric material such as silicon oxide ($SiO_2$).

Figure 12B:
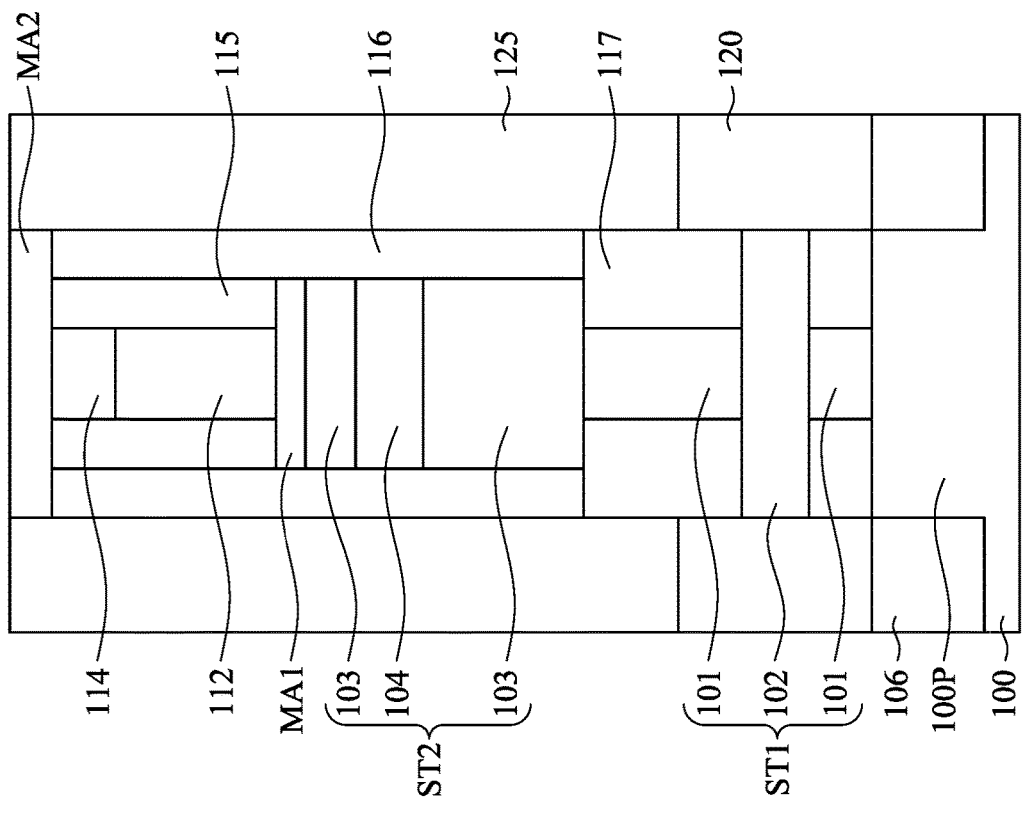
Figure 12A:
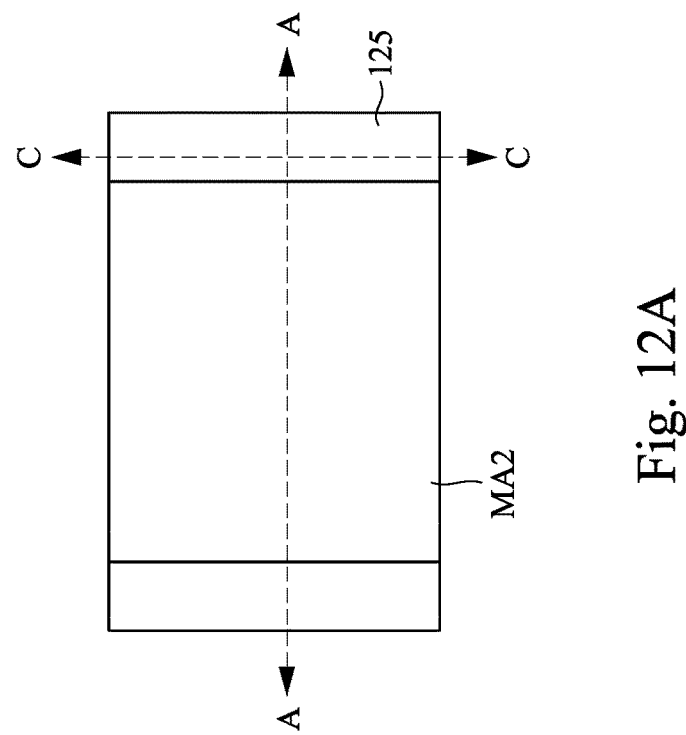
Figure 12C:
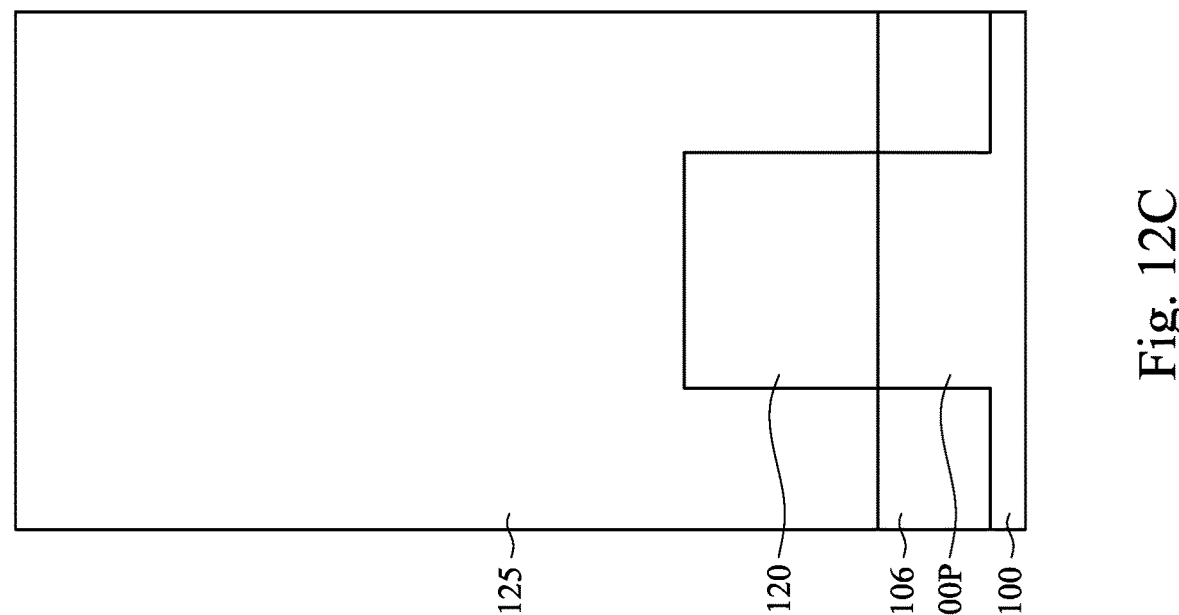

Reference is made to FIGS. 12A to 12C, in which FIG. 12A is a top view of a semiconductor device, FIG. 12B is a cross-sectional view along line A-A of FIG. 12A, and FIG. 12C is a cross-sectional view along line C-C of FIG. 12A. First source/drain epitaxy structures 120 are formed on opposite ends of the first semiconductor layer 102. The first source/drain epitaxy structures 120 may be formed by suitable deposition process, such as a selective epitaxial growth (SEG) process. In some embodiments, the SEG process may selectively grow a semiconductor material on exposed semiconductor surfaces, such as the exposed surfaces of the first semiconductor layer 102. In some embodiments, an implantation process may be performed to the first source/drain epitaxy structures 120. For example, the implantation process may include n-type dopants, such as phosphorus (P), arsenic (As), or antimony (Sb), or the like, such that the first source/drain epitaxy structures 120 are n-type epitaxy structures. On the other hand, the implantation process may include p-type dopants, such as boron (B), gallium (Ga), indium (In), aluminium (Al), or the like, such that the first source/drain epitaxy structures 120 are p-type epitaxy structures.

Conductive layers 125 are formed over the substrate 100 and covering the first source/drain epitaxy structures 120, respectively. In some embodiments, the conductive layers 125 may include metal, such as tungsten (W), aluminum (Al), copper (Cu), silver (Ag), or another suitable conductive material(s). The conductive layers 125 may be formed by, for example, depositing a conductive material blanket over the substrate 100 and covering the first source/drain epitaxy structures 120, and then performing a planarization process, such as CMP, to remove excess conductive material until top surface of the patterned mask MA2 is exposed.

Figure 13B:
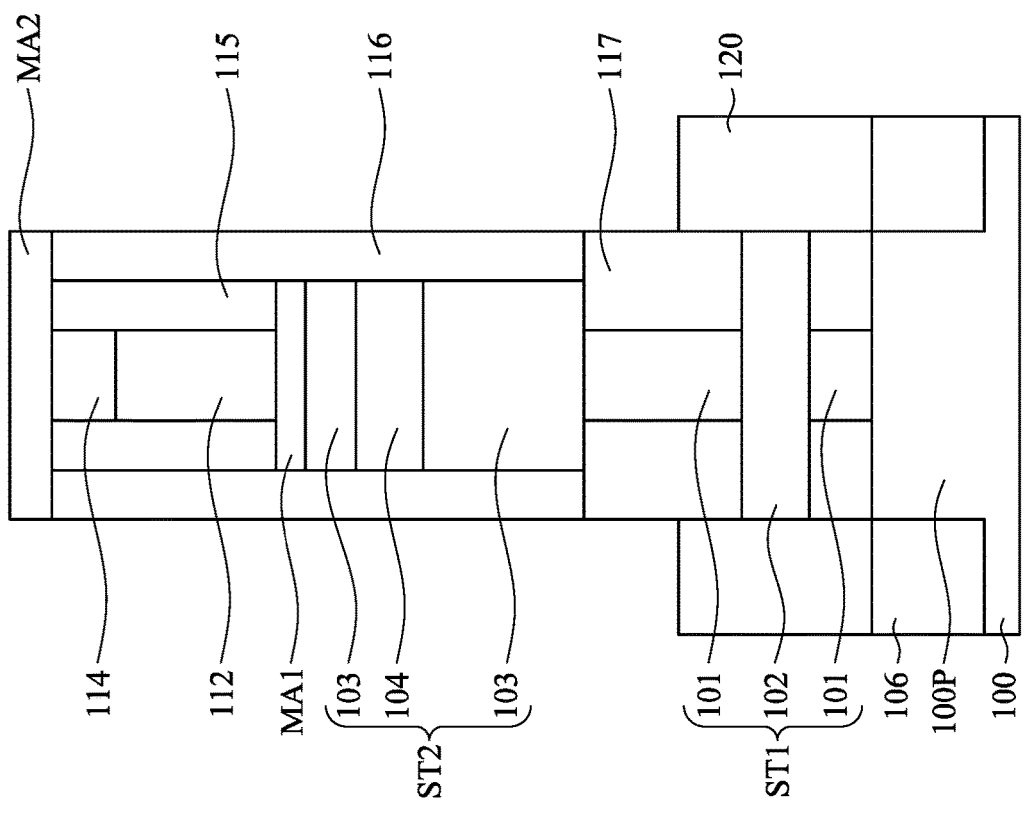
Figure 13A:
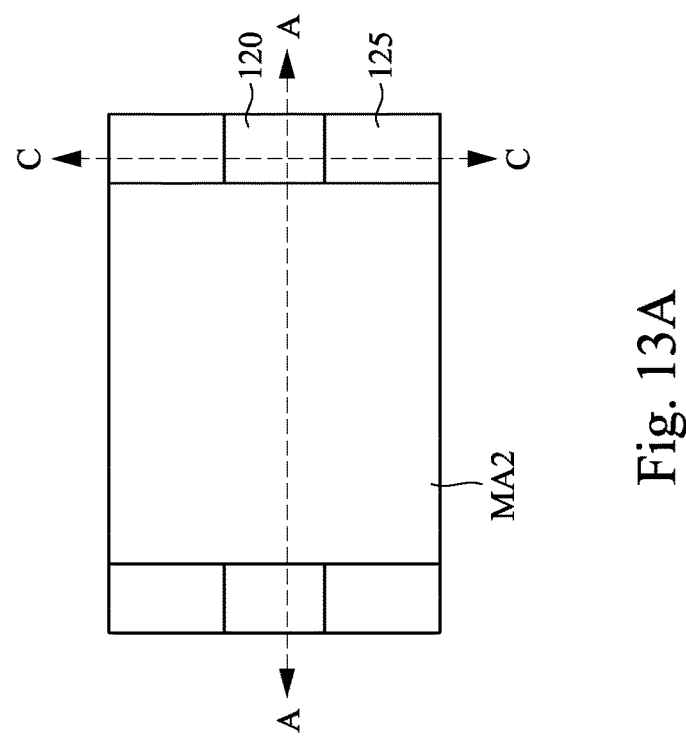
Figure 13C:
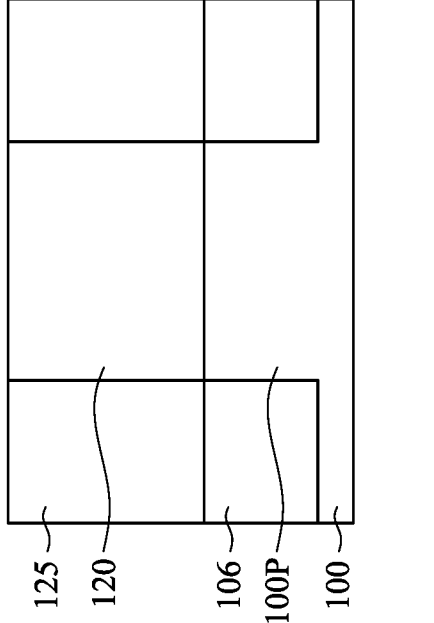

Reference is made to FIGS. 13A to 13C, in which FIG. 13A is a top view of a semiconductor device, FIG. 13B is a cross-sectional view along line A-A of FIG. 13A, and FIG. 13C is a cross-sectional view along line C-C of FIG. 13A. An etching back process is performed to the conductive layers 125, so as to lower top surfaces of the conductive layers 125 until the first source/drain epitaxy structures 120 are exposed. After the etching back process is complete, remaining portions of the conductive layers 125 are on opposite sides of the first source/drain epitaxy structures 120 (see FIG. 13C). In some embodiments, the conductive layers 125 may be etched using dry etch, wet etch, or the like.

Figure 14B:
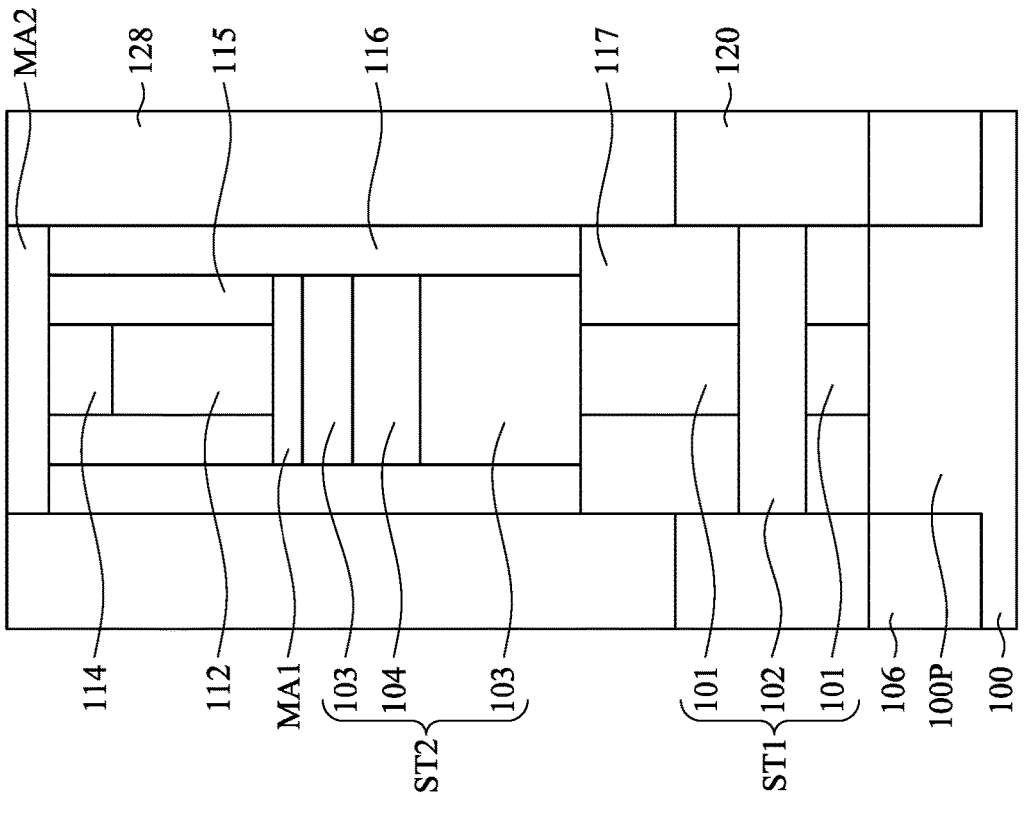
Figure 14A:
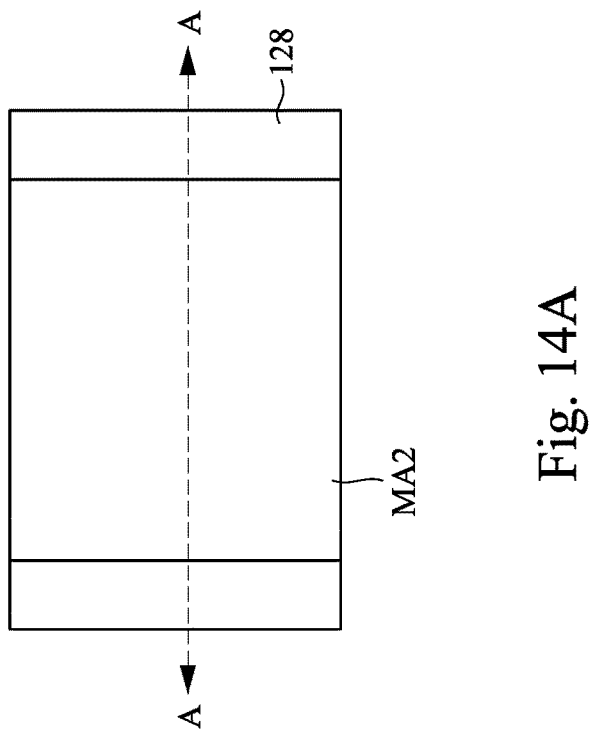

Reference is made to FIGS. 14A and 14B, in which FIG. 14A is a top view of a semiconductor device, and FIG. 14B is a cross-sectional view along line A-A of FIG. 14A. Isolation structures 128 are formed over the substrate 100 and covering the first source/drain epitaxy structures 120 and the conductive layers 125. In some embodiments, the isolation structures 128 may include silicon oxide ($SiO_2$), silicon nitride, silicon oxynitride, tetraethoxysilane (TEOS), phosphosilicate glass (PSG), borophosphosilicate glass (BPSG), low-k dielectric material, and/or other suitable dielectric materials. The isolation structures 128 may be formed by, for example, depositing a dielectric material blanket over the substrate 100 and covering the first source/drain epitaxy structures 120 and the conductive layers 125, and then performing a planarization process, such as CMP, to remove excess dielectric material until top surface of the patterned mask MA2 is exposed.

Figure 15B:
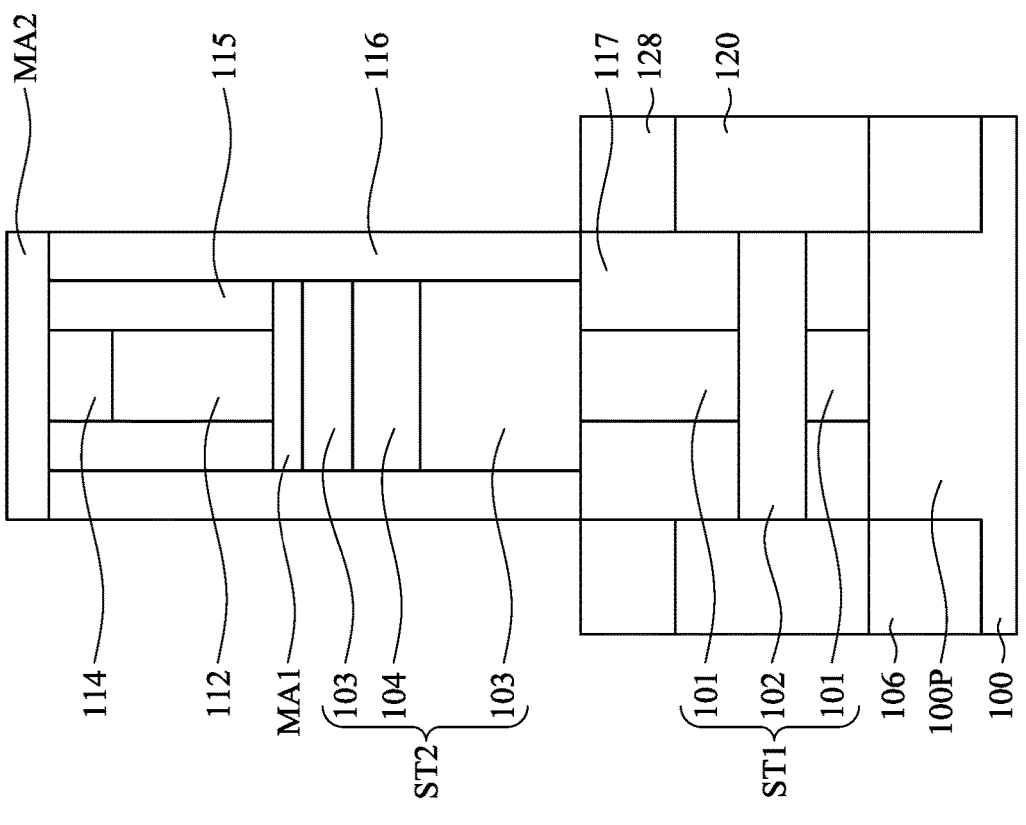
Figure 15A:
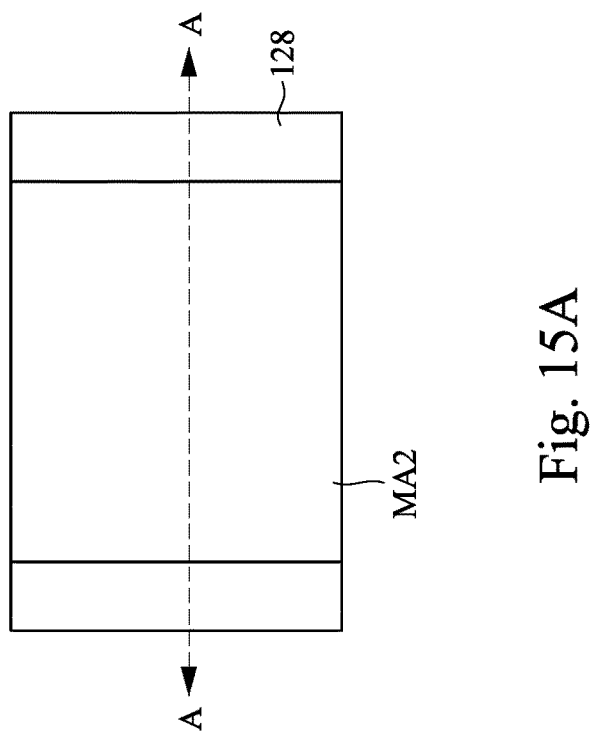
Figure 15C:
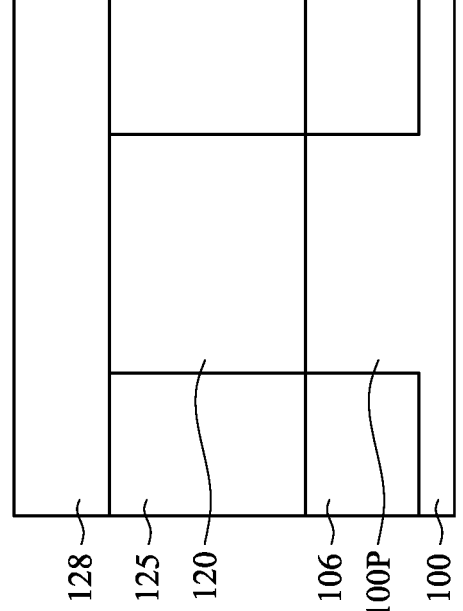

Reference is made to FIGS. 15A to 15C, in which FIG. 15A is a top view of a semiconductor device, FIG. 15B is a cross-sectional view along line A-A of FIG. 15A, and FIG. 15C is a cross-sectional view along line C-C of FIG. 15A. An etching back process is performed to the isolation structures 128, so as to lower top surfaces of the isolation structures 128. In greater detail, the top surfaces of the isolation structures 128 may be lowered to a level that is below the second semiconductor layer 104. In some embodiments, the isolation structures 128 may be etched using dry etch, wet etch, or the like.

Figure 16B:
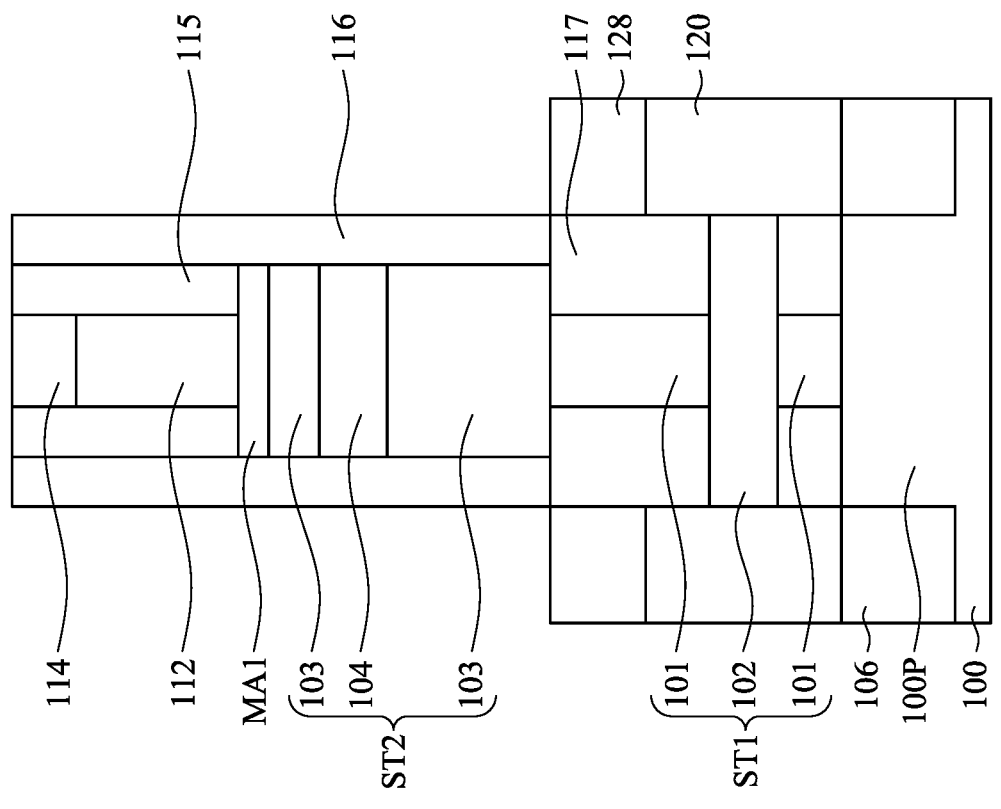
Figure 16A:
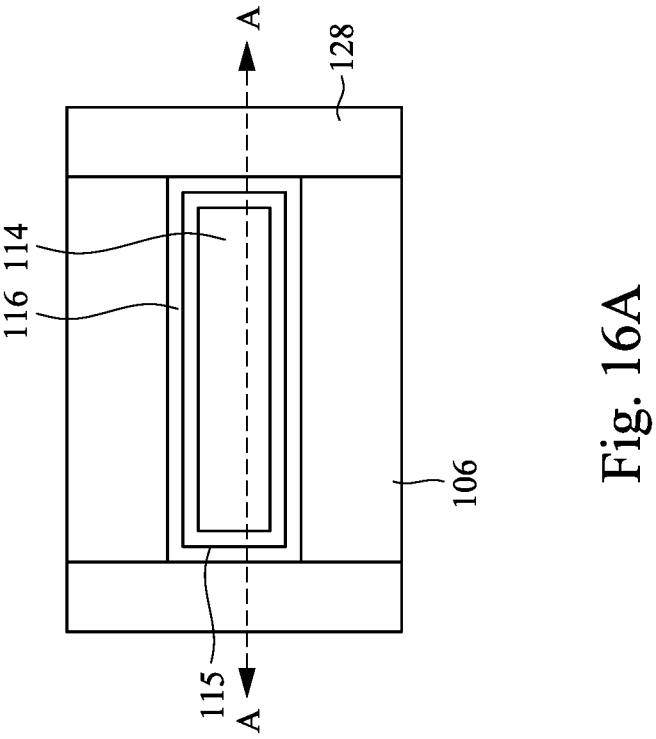

Reference is made to FIGS. 16A and 16B, in which FIG. 16A is a top view of a semiconductor device, and FIG. 16B is a cross-sectional view along line A-A of FIG. 16A. The patterned mask MA2 is removed. As a result, top surfaces of the dummy gate hard mask 114, the gate spacers 115, and the spacers 116 are exposed. In some embodiments, the patterned mask MA2 may be removed using suitable etching process, such as dry etch, wet etch, or the like.

Figure 17B:
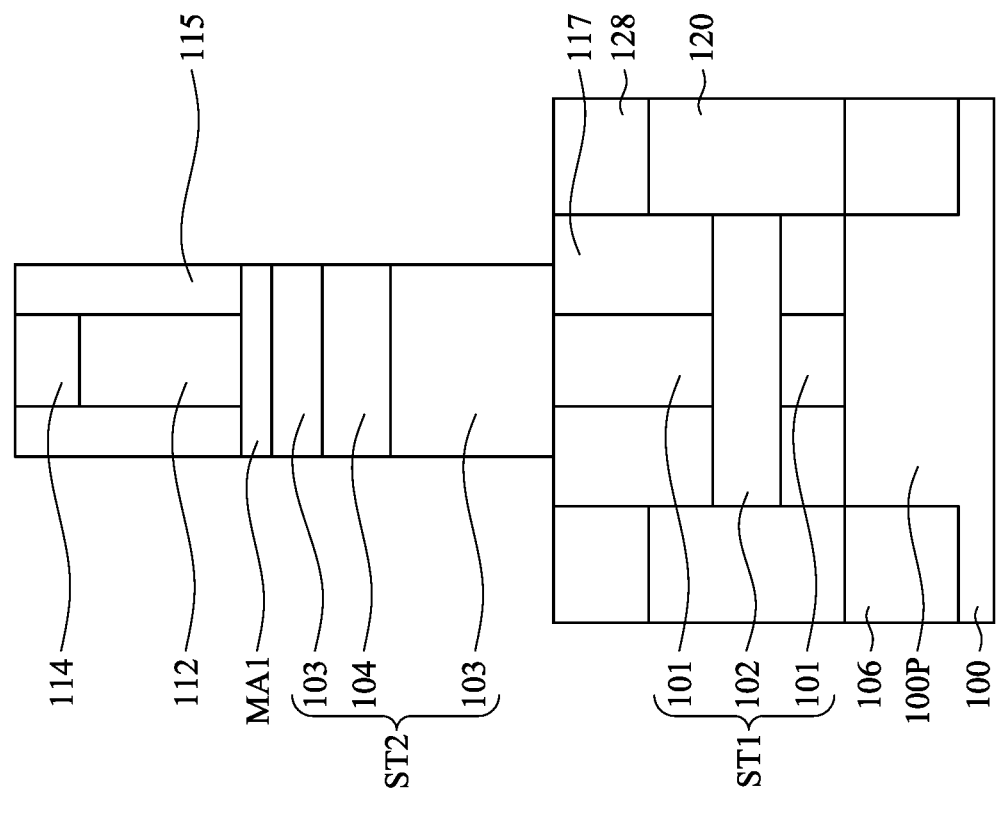
Figure 17A:
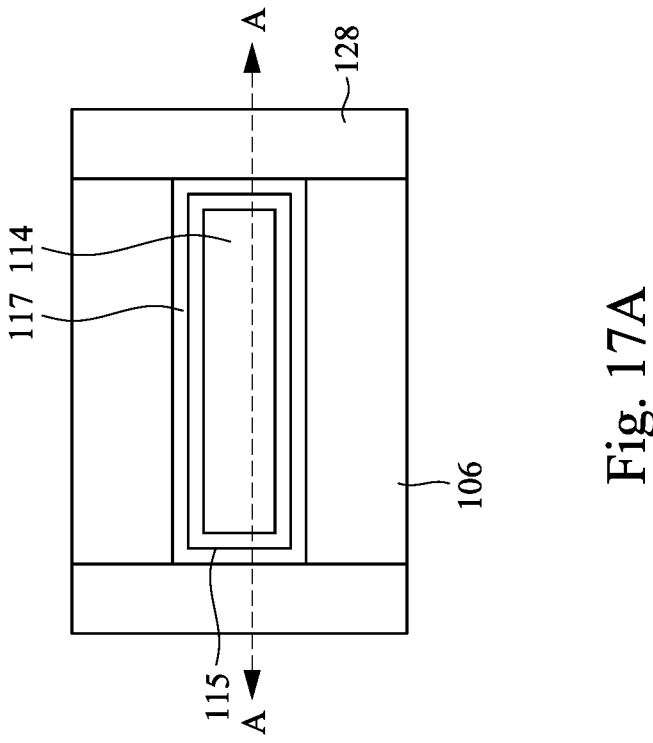

Reference is made to FIGS. 17A and 17B, in which FIG. 17A is a top view of a semiconductor device, and FIG. 17B is a cross-sectional view along line A-A of FIG. 17A. The spacers 116 are removed. As a result, sidewalls of the second sacrificial layers 103 and the second semiconductor layer 104 are exposed. In some embodiments, portions of top surfaces of the inner spacers 117 may also be exposed after the spacers 116 are removed. In some embodiments, the spacers 116 may be removed using suitable etching process, such as dry etch, wet etch, or the like.

Figure 18B:
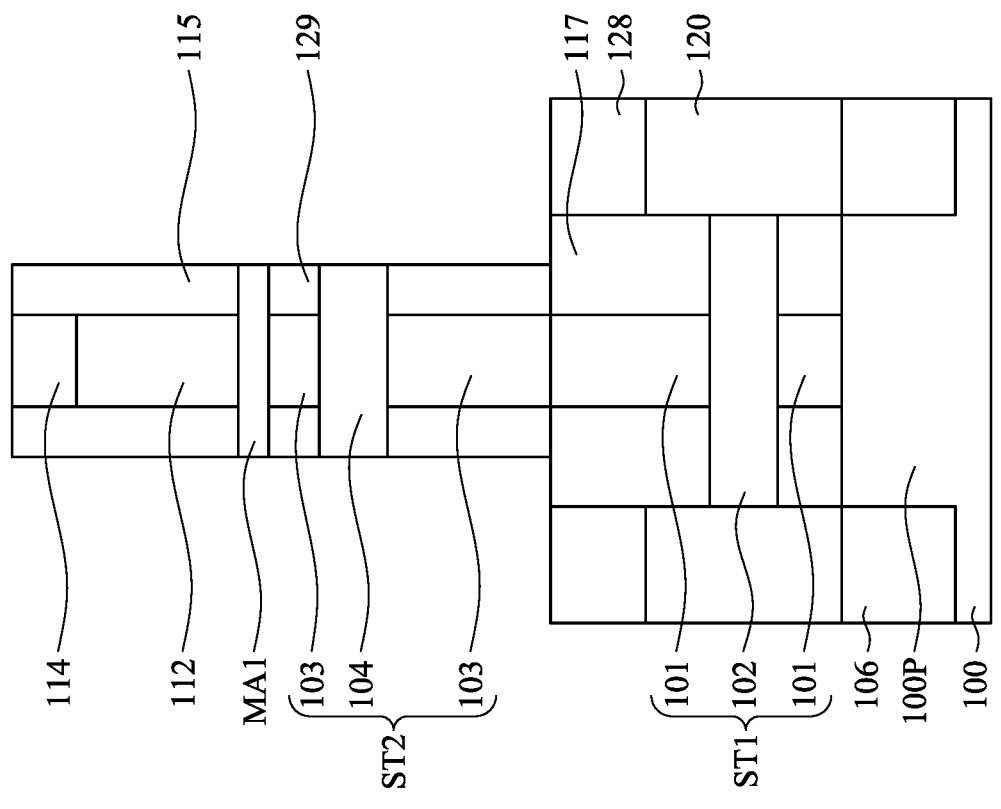
Figure 18A:
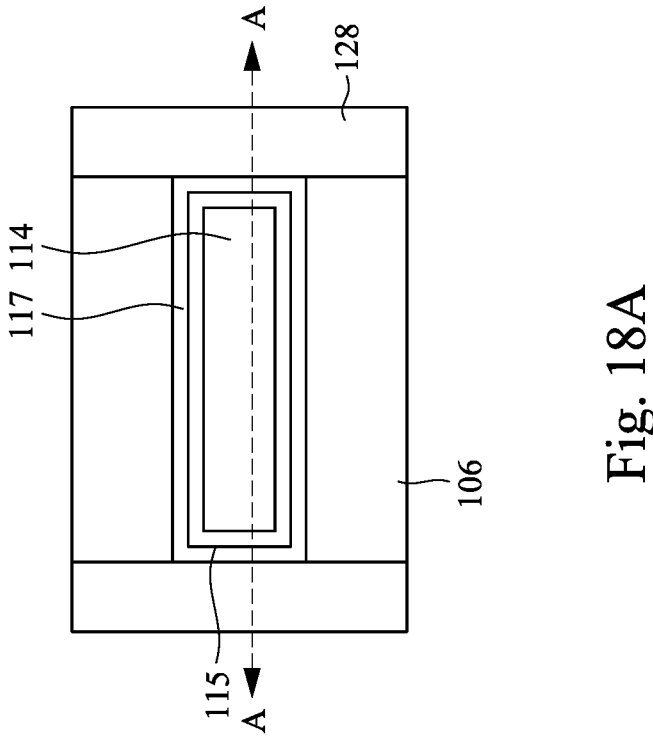

Reference is made to FIGS. 18A and 18B, in which FIG. 18A is a top view of a semiconductor device, and FIG. 18B is a cross-sectional view along line A-A of FIG. 18A. The second sacrificial layers 103 are laterally etched to form sidewall recesses. Then, inner spacers 129 are formed in the sidewall recesses on opposite ends of each of the second sacrificial layers 103. In some embodiments, the inner spacers 129 may be formed by, for example, depositing an inner spacer layer blanket over the substrate 100 and filling the sidewall recesses, and then performing an anisotropic etching to remove portions of the inner spacer layer outside the sidewall recesses, leaving the remaining portions of the inner spacer layer in the sidewall recesses as the inner spacers 129. The inner spacers 129 may be deposited by a conformal deposition process, such as CVD, ALD, or the like. The inner spacer layer may include material such as SiN, SiOCN, SiCN, SIOC.

Figure 19B:
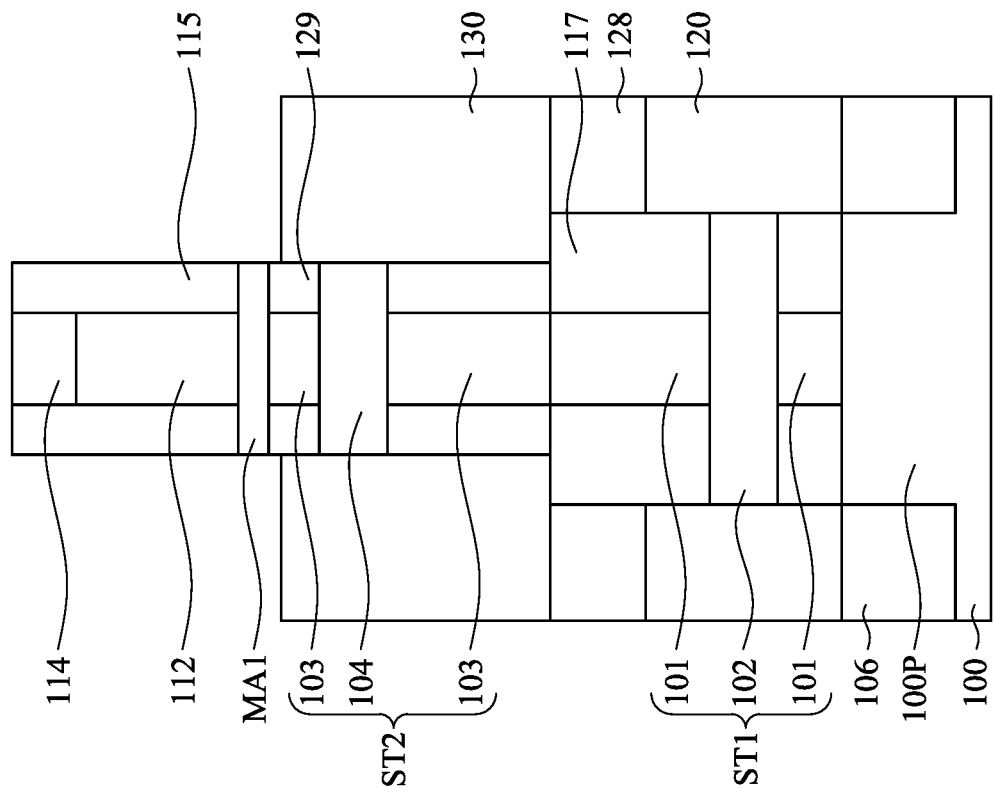
Figure 19A:
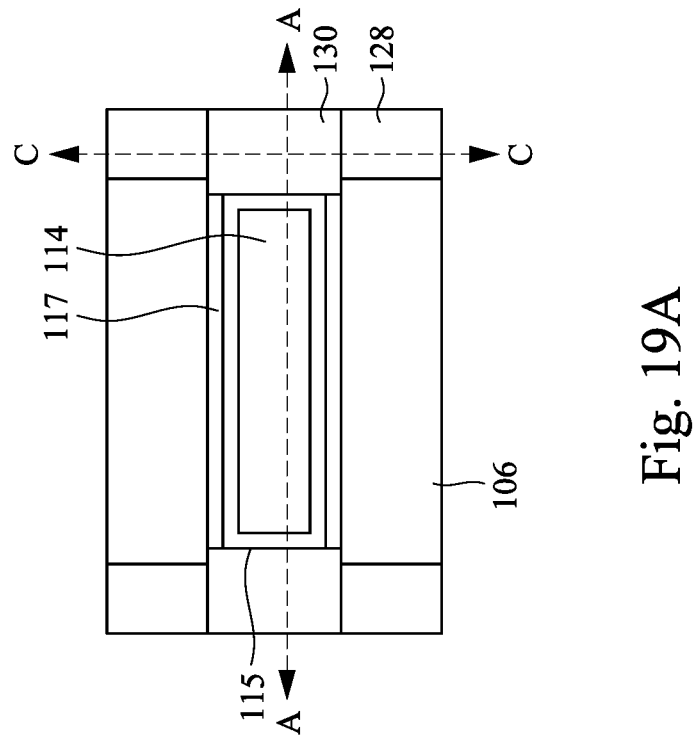
Figure 19C:
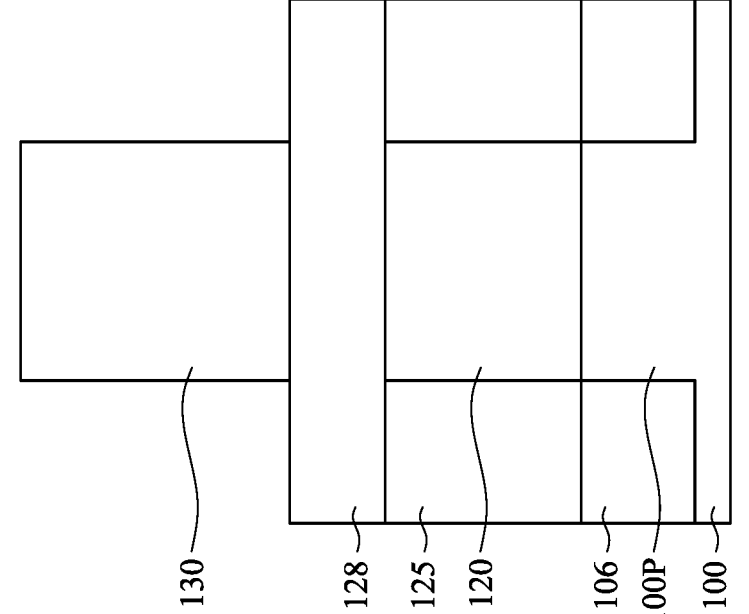

Reference is made to FIGS. 19A to 19C, in which FIG. 19A is a top view of a semiconductor device, FIG. 19B is a cross-sectional view along line A-A of FIG. 19A, and FIG. 19C is a cross-sectional view along line C-C of FIG. 19A. Second source/drain epitaxy structures 130 are formed on opposite ends of the second semiconductor layer 104. The second source/drain epitaxy structures 130 may be formed by suitable deposition process, such as a selective epitaxial growth (SEG) process. In some embodiments, the SEG process may selectively grow a semiconductor material on exposed semiconductor surfaces, such as the exposed surfaces of the second semiconductor layer 104. In some embodiments, an implantation process may be performed to the second semiconductor layer 104. For example, the implantation process may include n-type dopants, such as phosphorus (P), arsenic (As), or antimony (Sb), or the like, such that the second source/drain epitaxy structures 130 are n-type epitaxy structures. On the other hand, the implantation process may include p-type dopants, such as boron (B), gallium (Ga), indium (In), aluminium (Al), or the like, such that the second source/drain epitaxy structures 130 are p-type epitaxy structures. In some embodiments, the first source/drain epitaxy structures 120 and the second source/drain epitaxy structures 130 include different conductivity types. For example, if the first source/drain epitaxy structures 120 are doped with n-type impurities, the second source/drain epitaxy structures 130 are doped with p-type impurities. Alternatively, if the first source/drain epitaxy structures 120 are doped with p-type impurities, the second source/drain epitaxy structures 130 are doped with n-type impurities.

Figure 20B:
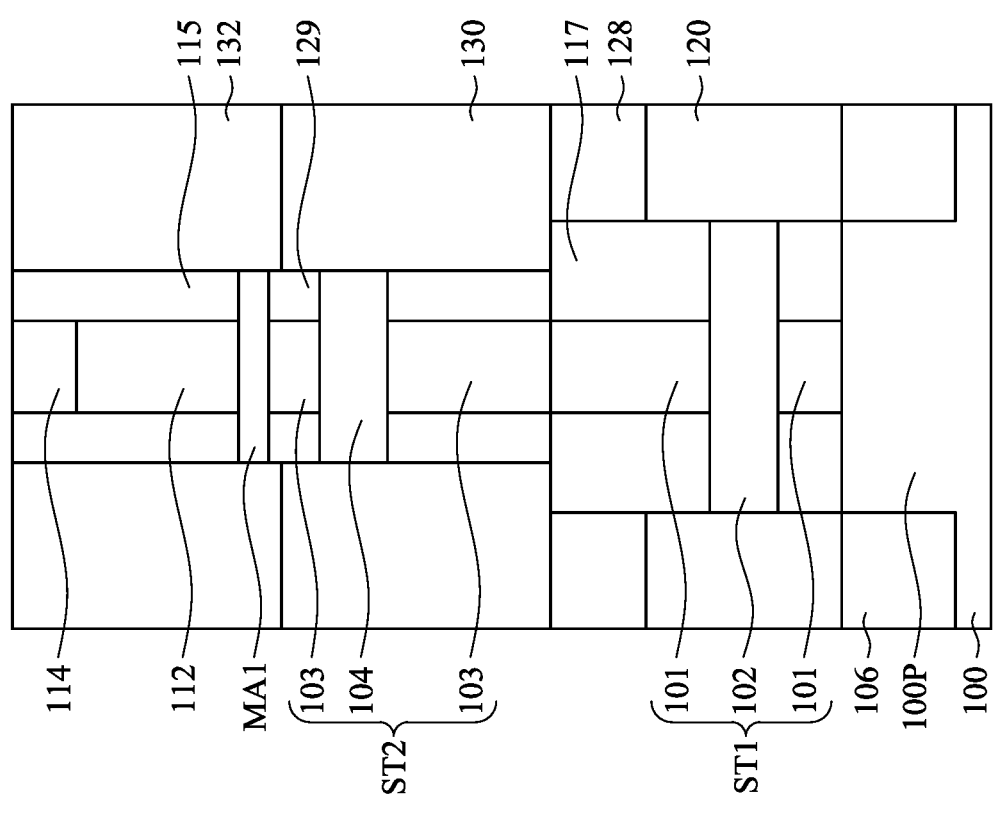
Figure 20A:
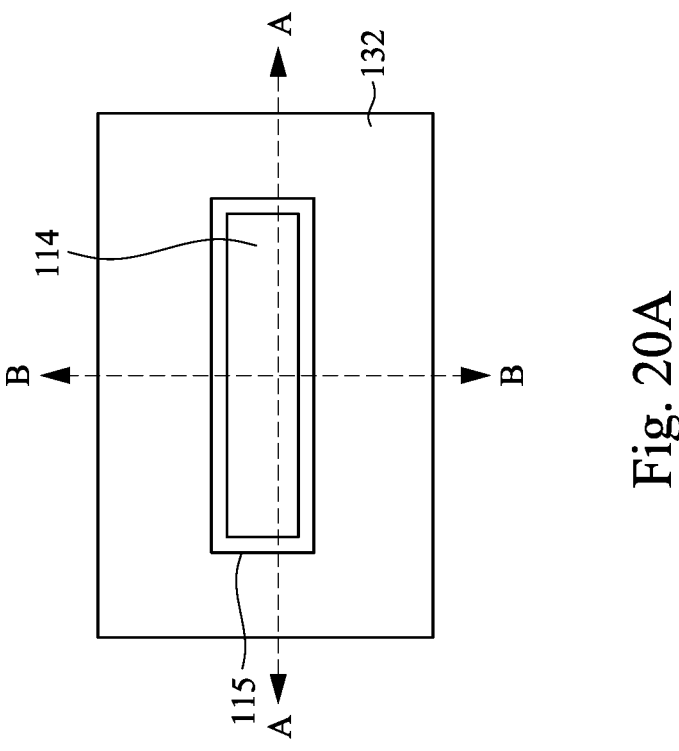
Figure 20C:
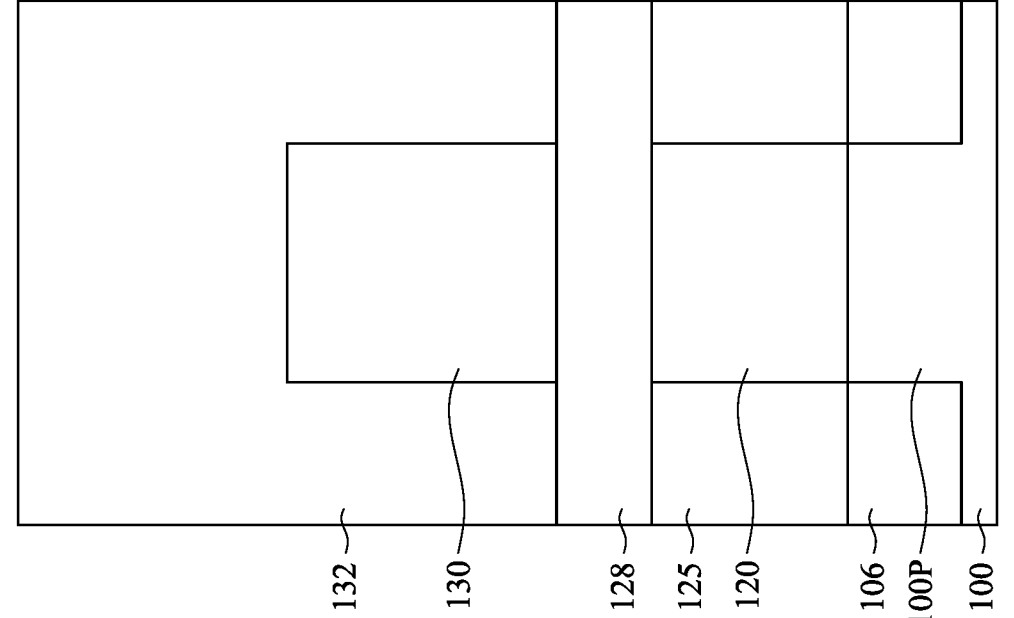

Reference is made to FIGS. 20A to 20C, in which FIG. 20A is a top view of a semiconductor device, FIG. 20B is a cross-sectional view along line A-A of FIG. 20A, and FIG. 20C is a cross-sectional view along line C-C of FIG. 20A. Isolation structures 132 are formed over the substrate 100 and covering the second source/drain epitaxy structures 130. The isolation structures 132 may also be in contact with top surfaces of the isolation structures 128 (see FIG. 20C). In some embodiments, the isolation structures 132 may include silicon oxide ($SiO_2$), silicon nitride, silicon oxynitride, tetraethoxysilane (TEOS), phosphosilicate glass (PSG), borophosphosilicate glass (BPSG), low-k dielectric material, and/or other suitable dielectric materials. The isolation structures 132 may be formed by, for example, depositing a dielectric material blanket over the substrate 100 and covering the second source/drain epitaxy structures 130 and the isolation structures 1128, and then performing a planarization process, such as CMP, to remove excess dielectric material until top surfaces of the dummy gate hard mask 114 and the gate spacers 115 are exposed.

Figure 21B:
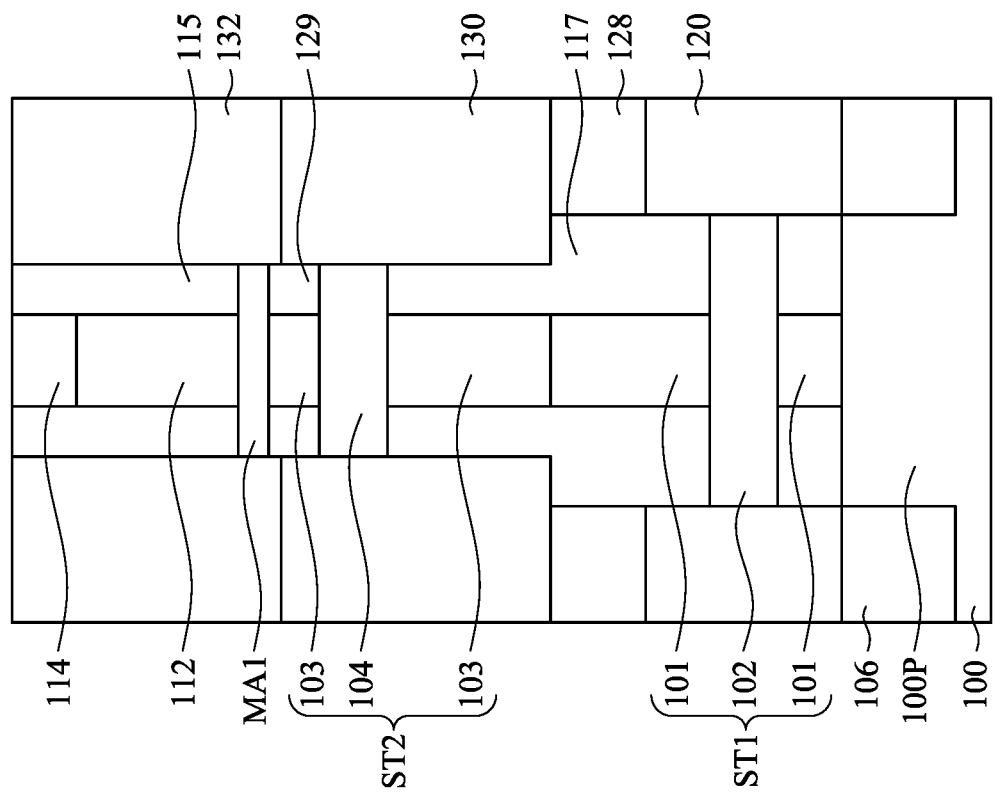
Figure 21A:
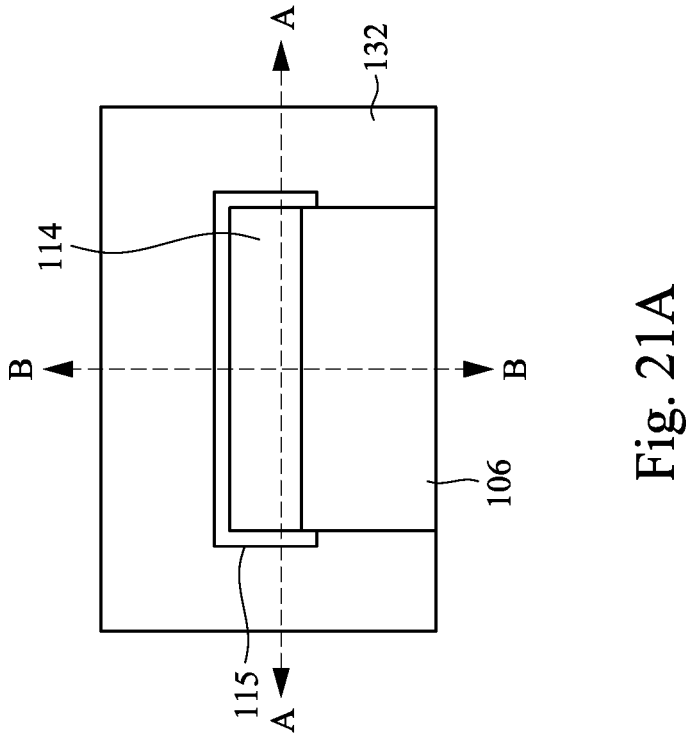
Figure 21C:
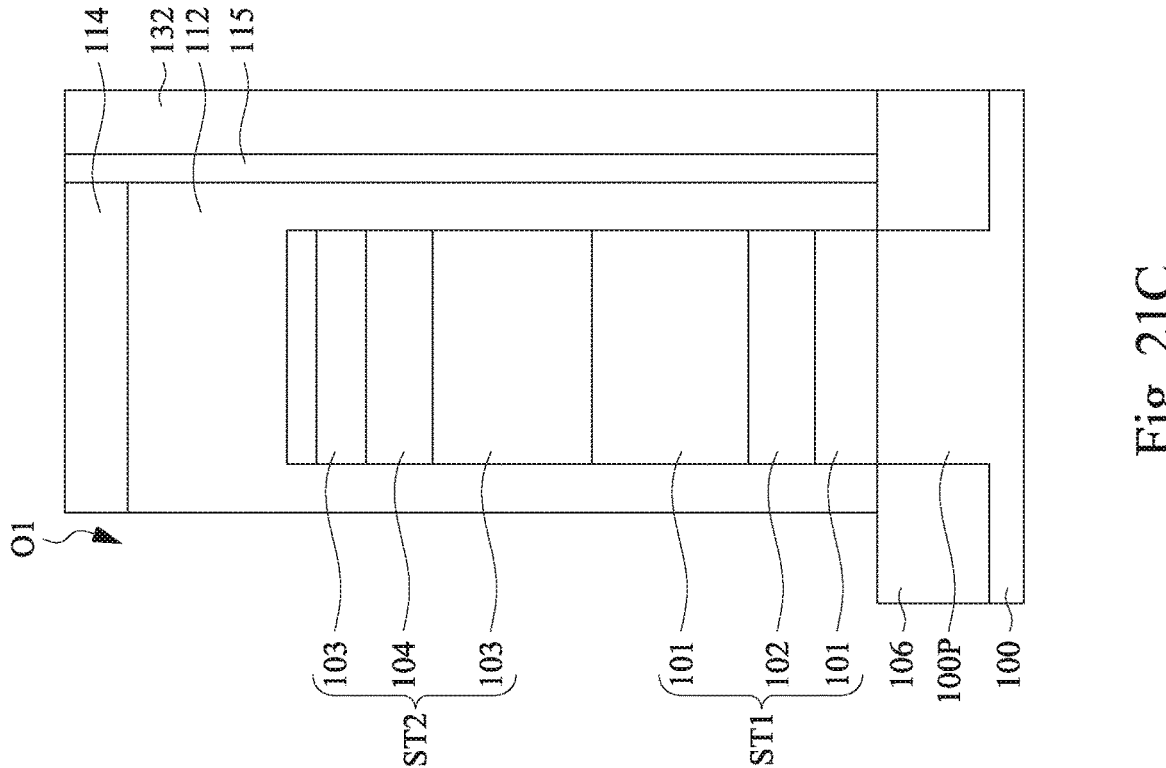

Reference is made to FIGS. 21A to 21C, in which FIG. 21A is a top view of a semiconductor device, FIG. 21B is a cross-sectional view along line A-A of FIG. 21A, and FIG. 21C is a cross-sectional view along line B-B of FIG. 21A. A patterning process is performed to remove portions of the gate spacers 115 and the isolation structures 132 to form an opening O1 that expose a sidewall of the dummy gate structure 112 (see FIG. 21C). In some embodiments, the opening O1 may be formed by, for example, forming a photoresist layer having an opening over the substrate 100, performing an etching process to remove the portions of the gate spacers 115 and the isolation structures 132 exposed through the photoresist layer, and then removing the photoresist layer after the etching process is complete.

Figure 22B:
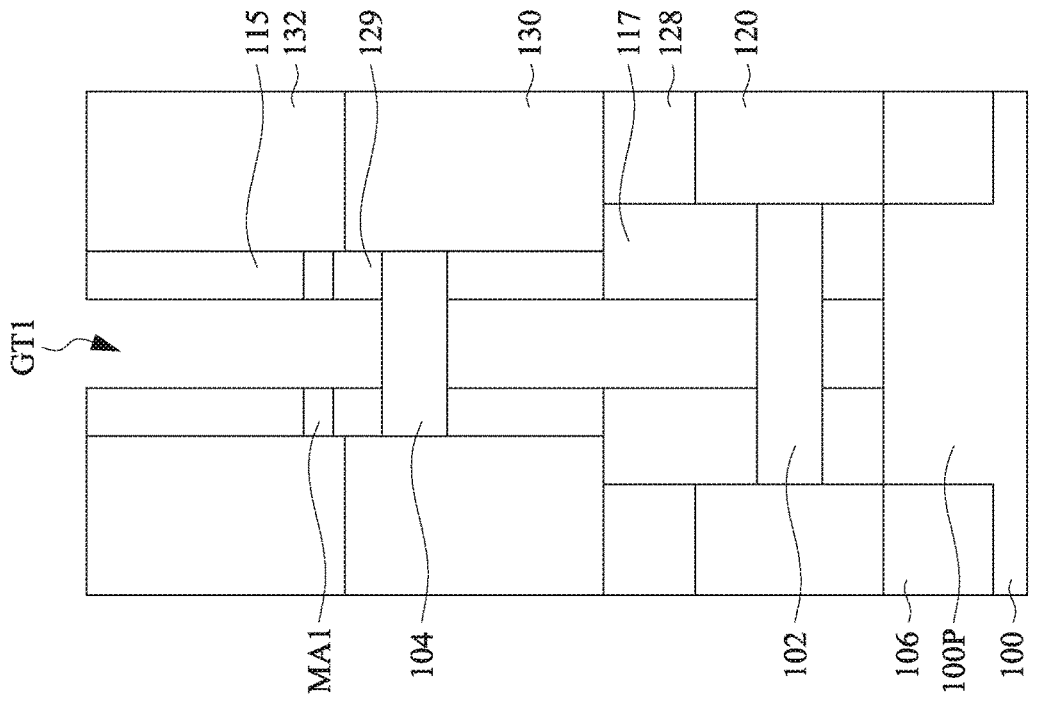
Figure 22A:
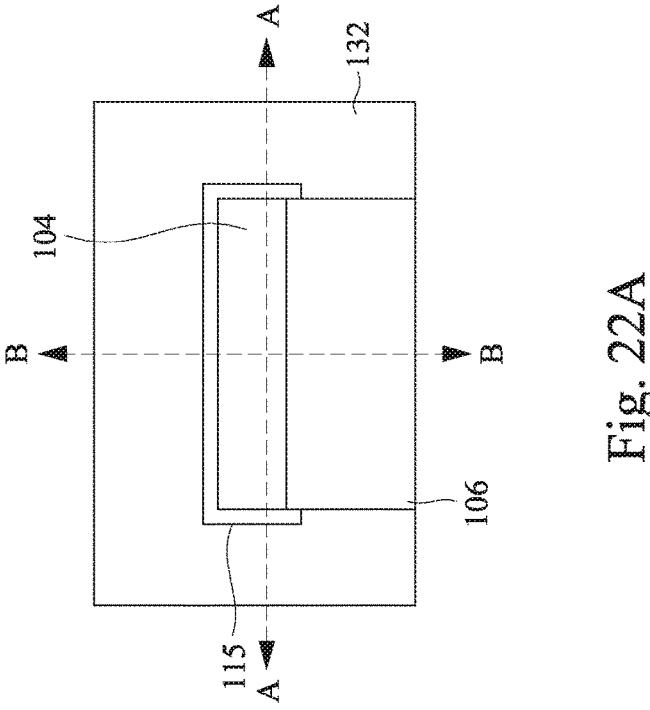
Figure 22C:
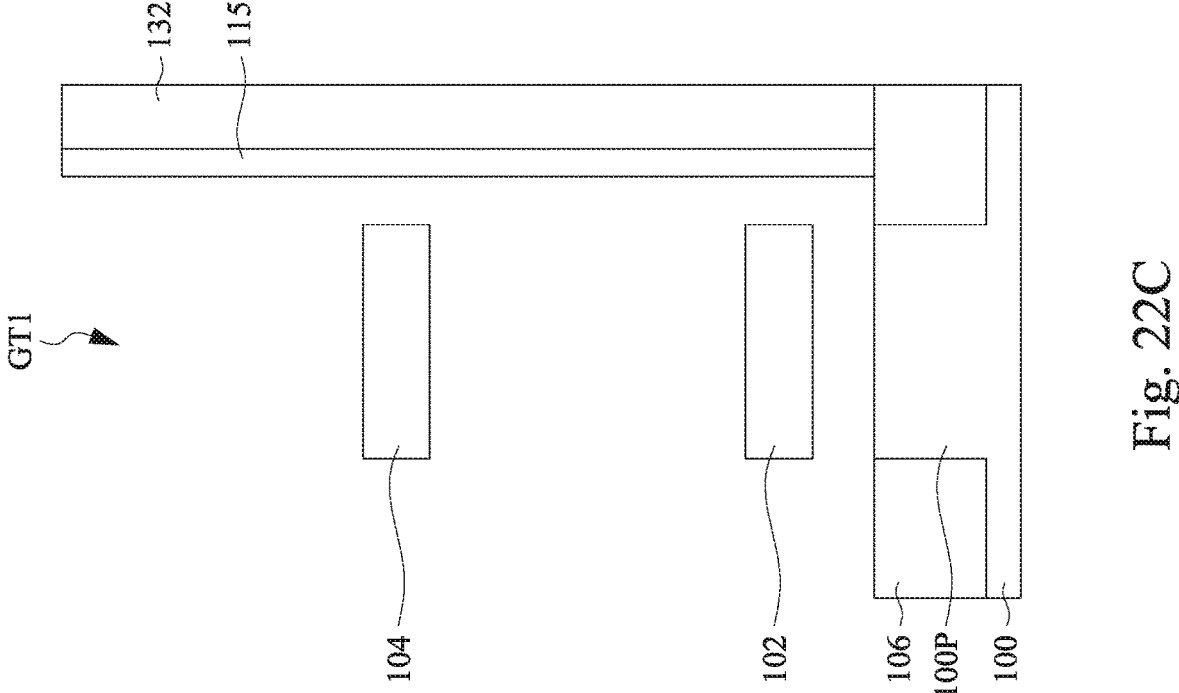

Reference is made to FIGS. 22A to 22C, in which FIG. 22A is a top view of a semiconductor device, FIG. 22B is a cross-sectional view along line A-A of FIG. 22A, and FIG. 22C is a cross-sectional view along line B-B of FIG. 22A. The dummy gate hard mask 114 and the dummy gate structure 112 are removed, so as to expose the first sacrificial layers 101 and the second sacrificial layers 103. A gate trench GT1 is formed between the gate spacers 115 (see FIG. 22B) as a result of the removal of the dummy gate structure 112. The dummy gate structure 112 may be removed using suitable etching process, such as dry etch, wet etch, or combinations thereof.

Then, the first sacrificial layers 101 and the second sacrificial layers 103 are removed through the gate trench GT1, such that the first semiconductor layer 102 and the second semiconductor layer 104 are suspended over the substrate 100. In greater detail, channel regions of the first semiconductor layer 102 and the second semiconductor layer 104 are suspended over the substrate 100 through the gate trench GT1. The first sacrificial layers 101 and the second sacrificial layers 103 may be removed using suitable etching process, such as dry etch, wet etch, or combinations thereof.

Figure 23B:
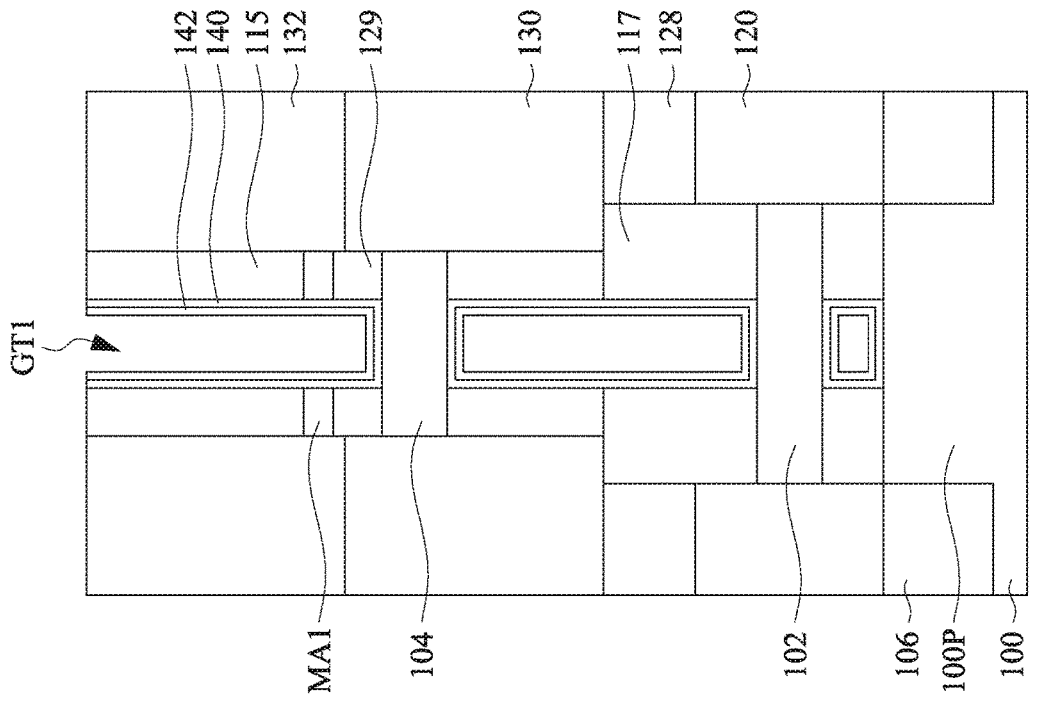
Figure 23A:
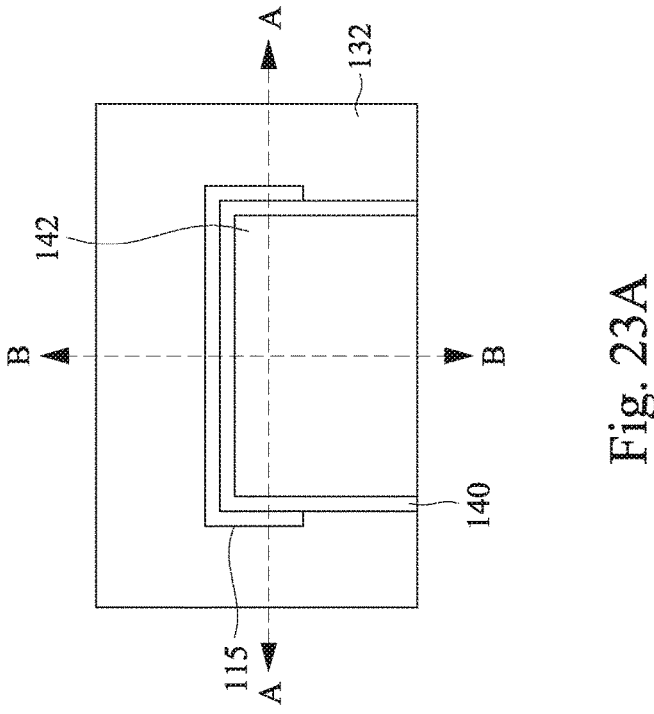
Figure 23C:
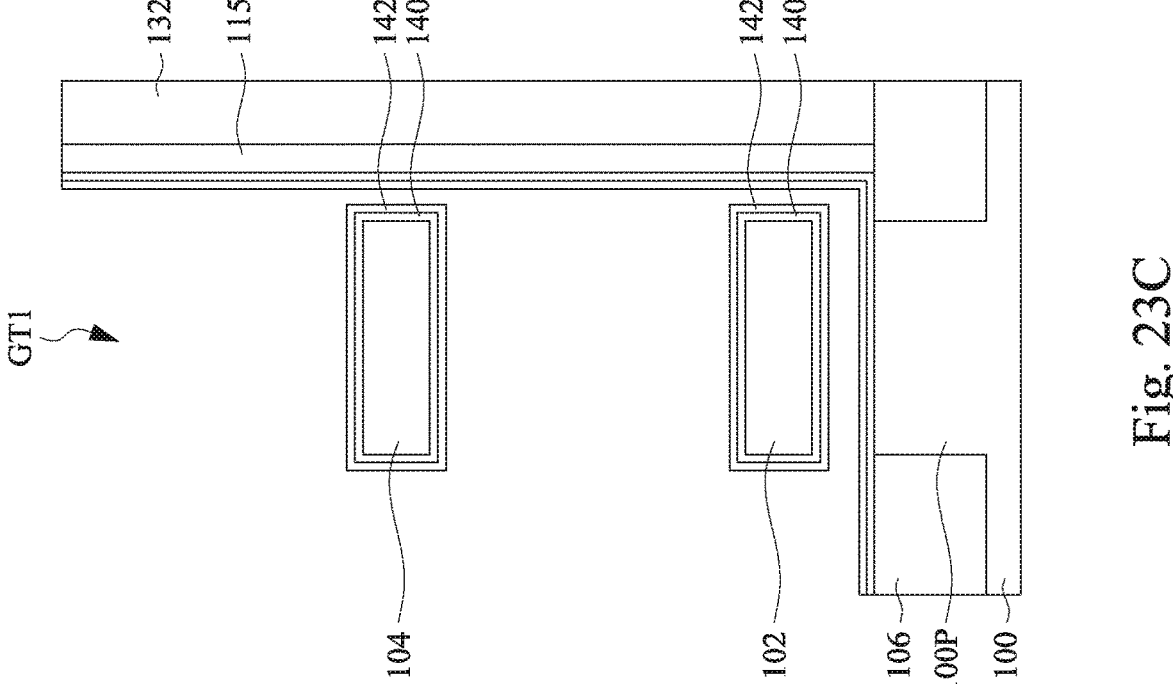

Reference is made to FIGS. 23A to 23C, in which FIG. 23A is a top view of a semiconductor device, FIG. 23B is a cross-sectional view along line A-A of FIG. 23A, and FIG. 23C is a cross-sectional view along line B-B of FIG. 23A. A gate dielectric layer 140 and a gate electrode 142 are sequentially deposited over the substrate 100 and wrapping around the channel regions of the first semiconductor layer 102 and the second semiconductor layer 104. In some embodiments, a portion of the gate dielectric layer 140 may also extend to top surfaces of the semiconductor strip 100P and the isolation structures 106 (see FIG. 23C). The gate dielectric layer 140 and the gate electrode 142 may be formed using a conformal deposition process, such as ALD, CVD, or the like.

The gate dielectric layer 140 may include an interfacial layer and/or a high-k dielectric. The interfacial layer may include silicon oxide ($SiO_2$). Examples of high-k dielectric material include $HfO_2$, HfSiO, HfSiON, HfTaO, HfTiO, HfZrO, zirconium oxide, aluminum oxide ($Al_2O_3$), titanium oxide, hafnium dioxide-alumina ($HfO_2$—$Al_2O_3$) alloy, other suitable high-k dielectric materials, and/or combinations thereof. The gate electrode 142 may include titanium-based material or tantalum-based material, such as Ti, TiN, Ta, TaN, or the like. The gate electrode 142 may also include metal, such as tungsten (W), aluminum (Al), copper (Cu), silver (Ag), or the like.

Figure 24B:
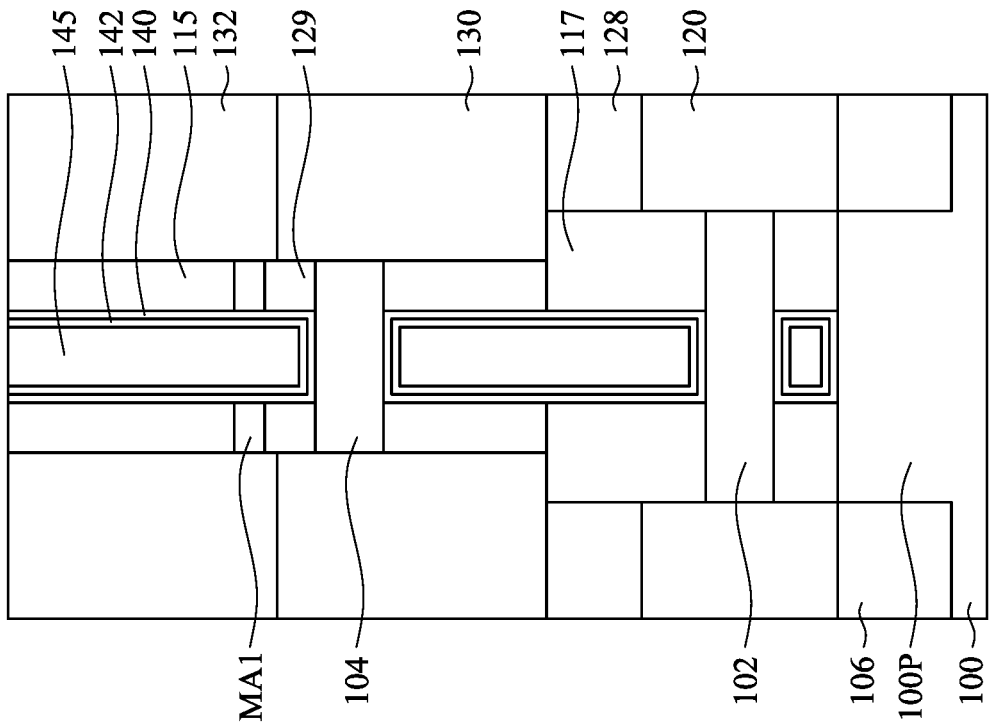
Figure 24A:
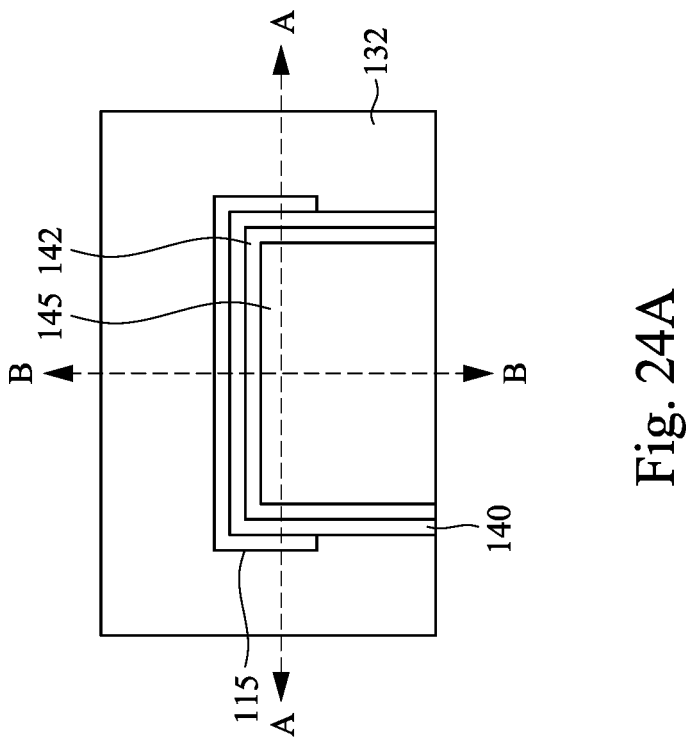
Figure 24C:
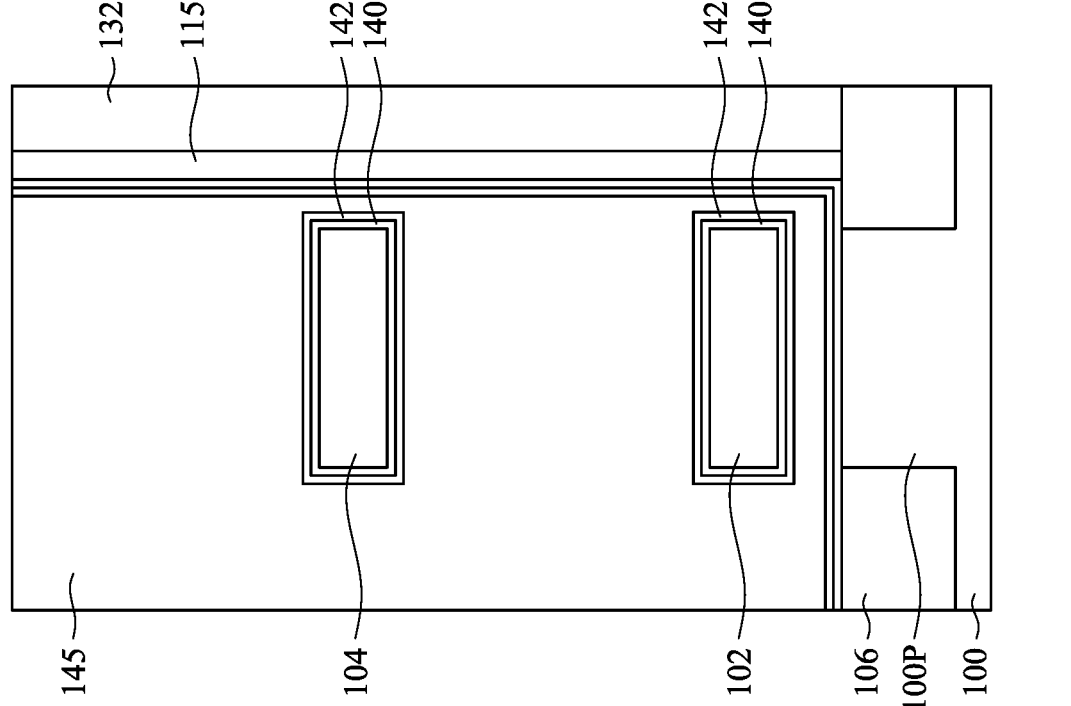

Reference is made to FIGS. 24A to 24C, in which FIG. 24A is a top view of a semiconductor device, FIG. 24B is a cross-sectional view along line A-A of FIG. 24A, and FIG. 24C is a cross-sectional view along line B-B of FIG. 24A. An isolation structure 145 is formed in the gate trench GT1 and wrapping around the first semiconductor layer 102 and the second semiconductor layer 104. In some embodiments, the isolation structure 145 may be silicon oxide (SiO$_2$). In other embodiments, the isolation structure 145 may include low-k dielectric material, such as phosphosilicate glass (PSG), borophosphosilicate glass (BPSG), fluorinated silicate glass (FSG), SiO$_x$C$_y$, silicon carbon material, or the like. In some embodiments, the isolation structure 145 may be formed by, for example, depositing a dielectric material filling the gate trench GT1, and then performing a planarization process, such as CMP, to remove excess dielectric material until the isolation structures 132 are exposed.

Figure 25B:
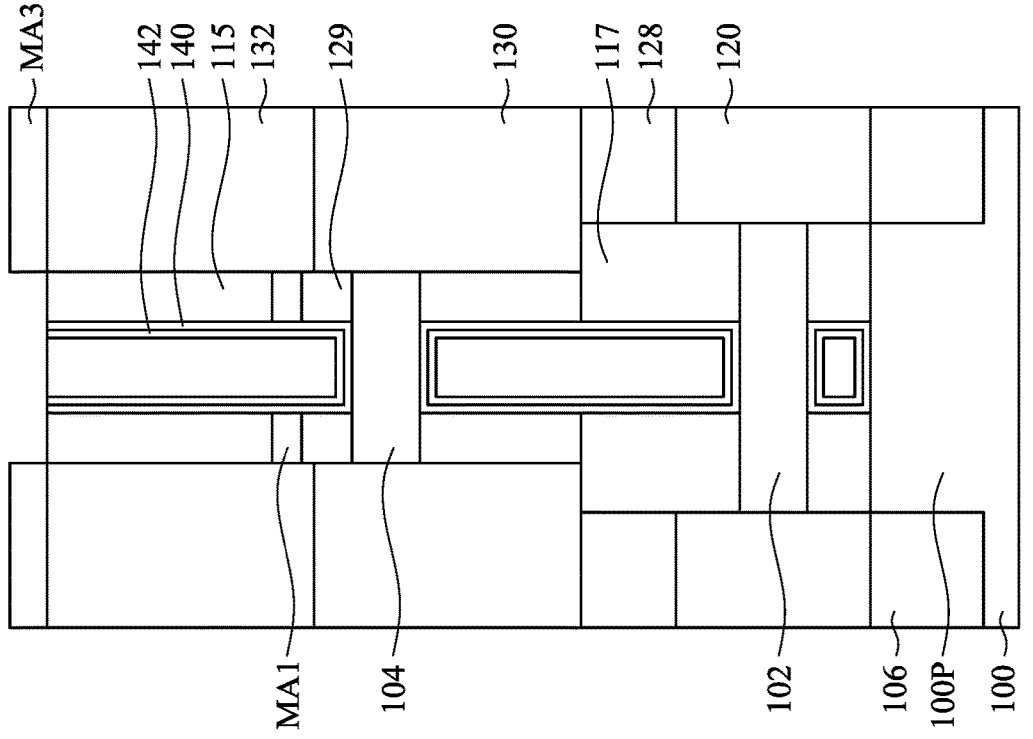
Figure 25A:
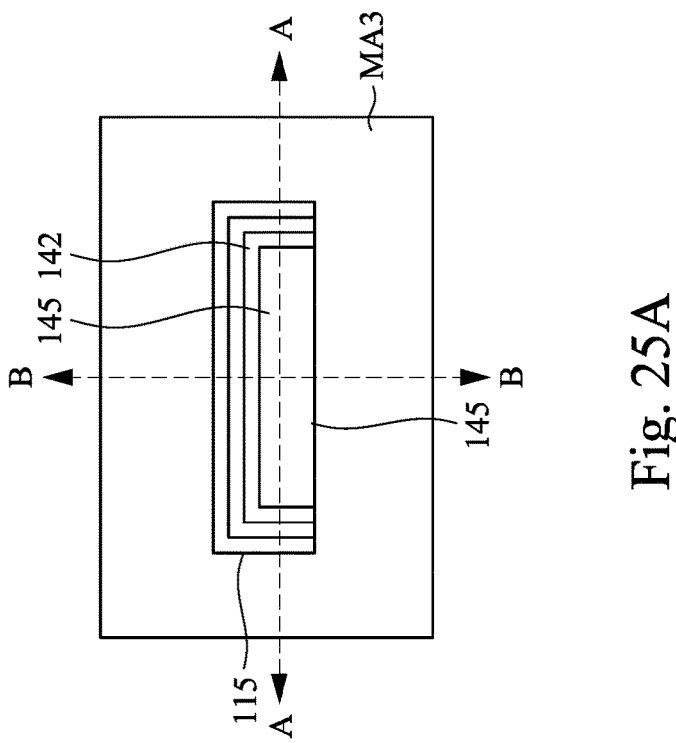
Figure 25C:
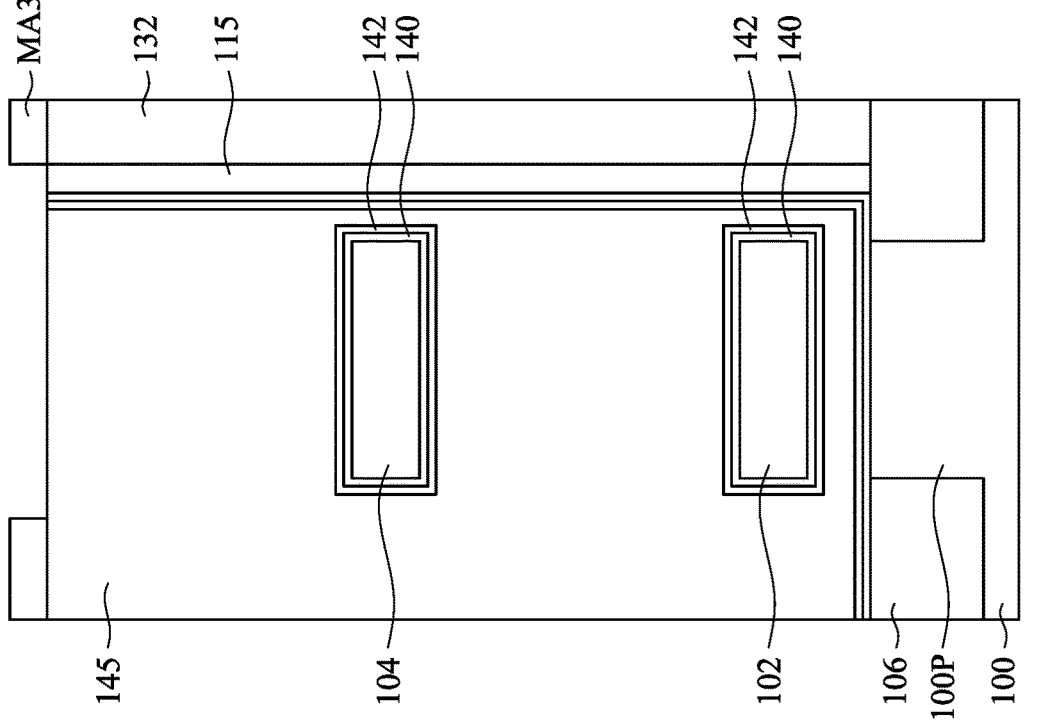

Reference is made to FIGS. 25A to 25C, in which FIG. 25A is a top view of a semiconductor device, FIG. 25B is a cross-sectional view along line A-A of FIG. 25A, and FIG. 25C is a cross-sectional view along line B-B of FIG. 25A. A patterned mask MA3 is formed over the substrate 100. In greater detail, the patterned mask MA3 is formed over the isolation structures 132 and having an opening expose a portion of the isolation structure 145. In some embodiments, the patterned mask MA3 may be a photoresist. In some embodiments, the patterned mask MA3 may be a hard mask, and may include dielectric material such as silicon oxide (SiO$_2$) or silicon nitride (SiN).

Figure 26B:
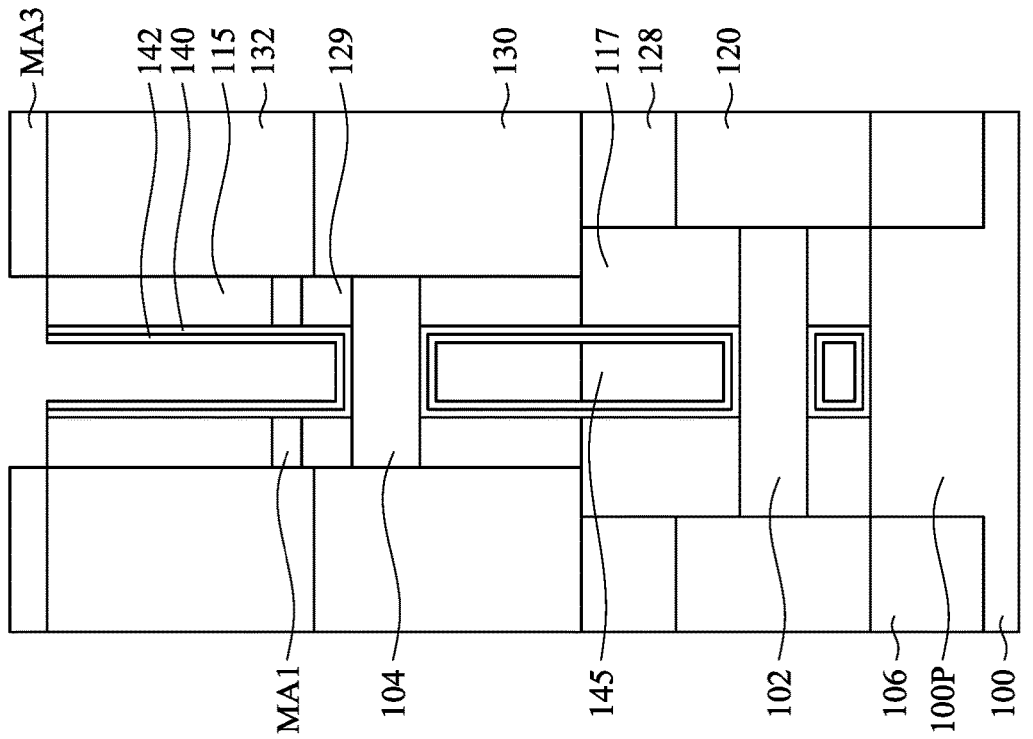
Figure 26A:
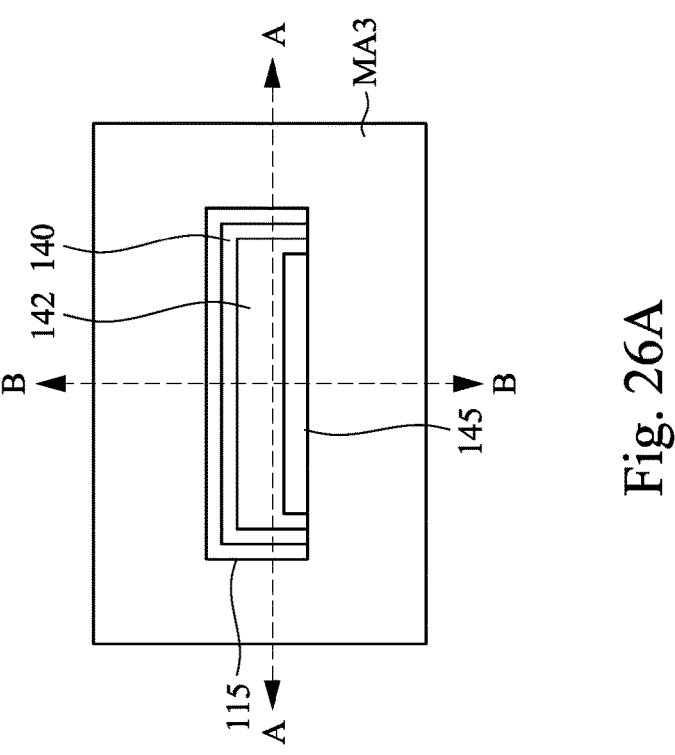
Figure 26C:
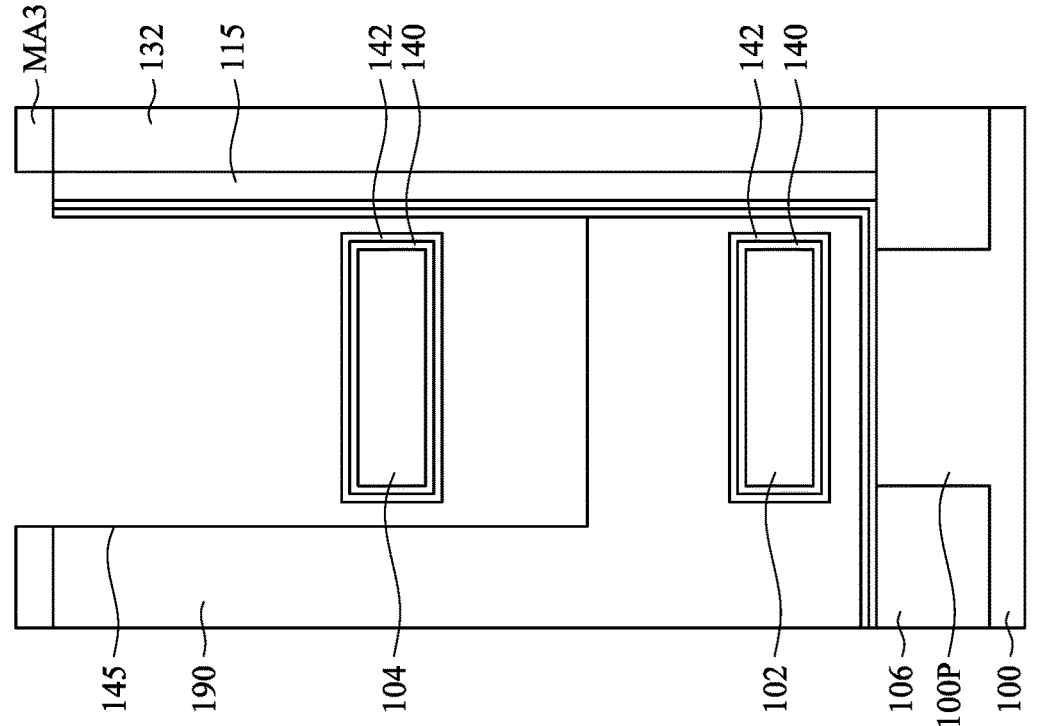

Reference is made to FIGS. 26A to 26C, in which FIG. 26A is a top view of a semiconductor device, FIG. 26B is a cross-sectional view along line A-A of FIG. 26A, and FIG. 26C is a cross-sectional view along line B-B of FIG. 26A. The portion of the isolation structure 145 exposed through the patterned mask MA3 is etched back, such that top surface of the portion of the isolation structure 145 is lowered to a level that is below the second semiconductor layer 104 and is above the first semiconductor layer 102. Accordingly, portions of the gate electrode 142 are exposed through the isolation structure 145. In greater detail, portions of the gate electrode 142 wrapping around the second semiconductor layer 104 are exposed after the etching back process. On the other hand, as a result of the etching back process, the channel region of the second semiconductor layer 104 is not wrapped by the isolation structure 145, while the channel region of the first semiconductor layer 102 remains wrapped by the isolation structure 145. The etching back process may include dry etch, wet etch, or combinations thereof.

Figure 27B:
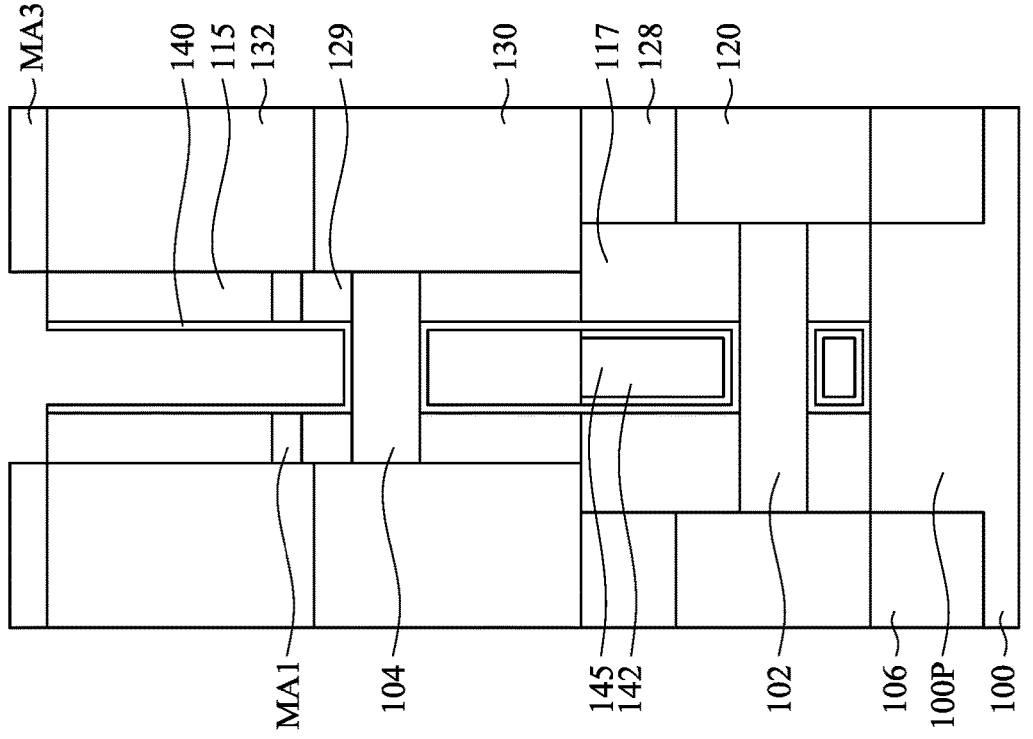
Figure 27A:
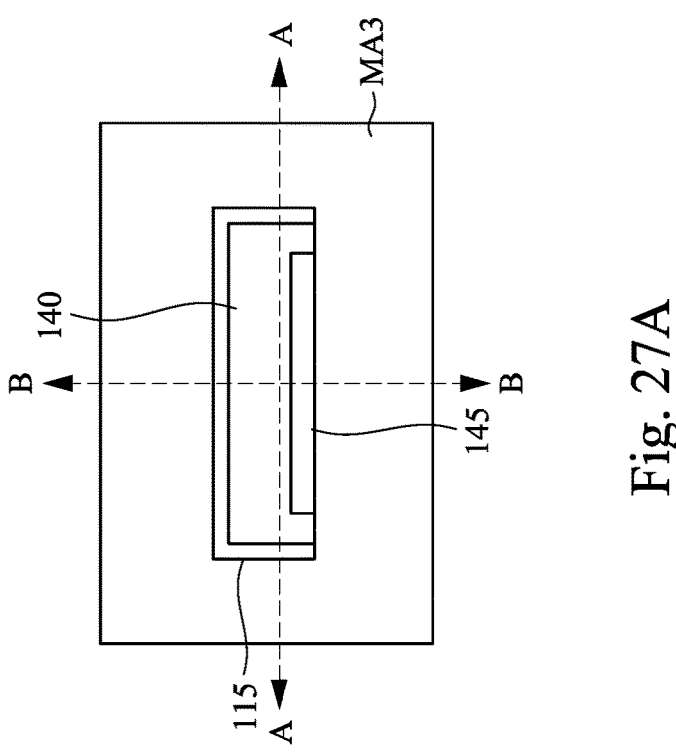
Figure 27C:
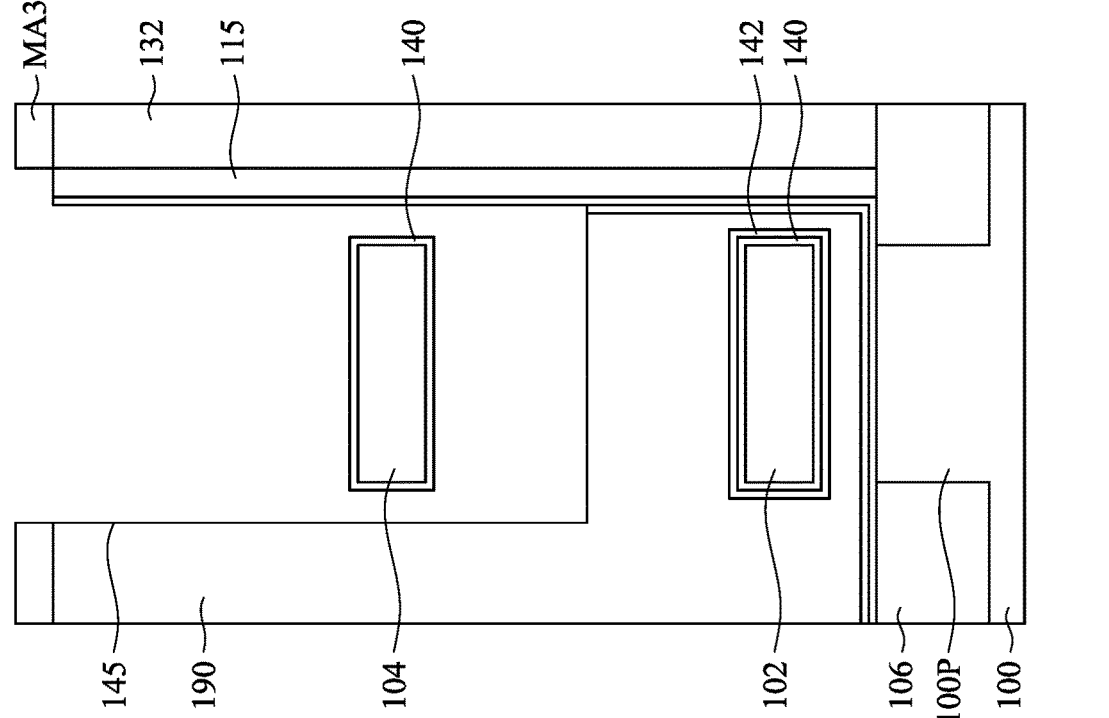

Reference is made to FIGS. 27A to 27C, in which FIG. 27A is a top view of a semiconductor device, FIG. 27B is a cross-sectional view along line A-A of FIG. 27A, and FIG. 27C is a cross-sectional view along line B-B of FIG. 27A. The portions of the gate electrode 142 exposed through the isolation structure 145 are removed, such that portions of the gate dielectric layer 140 wrapping around the second semiconductor layer 104 are exposed. The portions of the gate electrode 142 may be removed through suitable etching process, such as dry etch, wet etch, or combinations thereof.

Figure 28B:
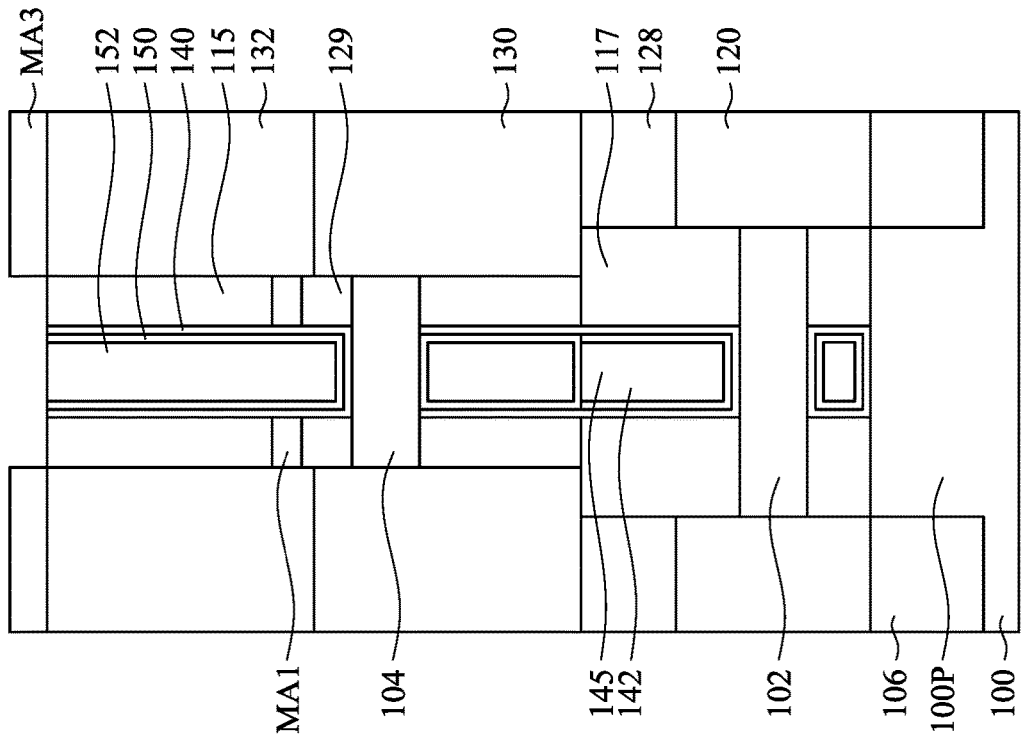
Figure 28A:
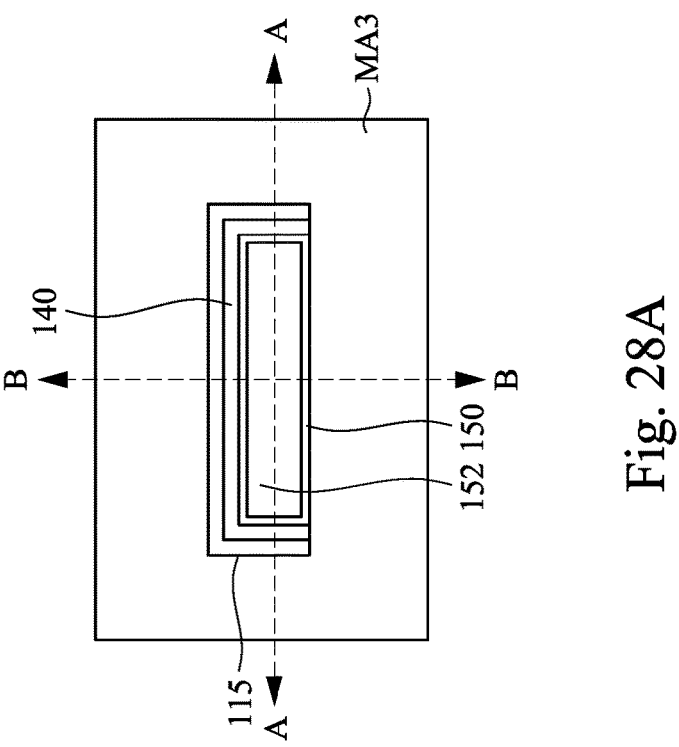
Figure 28C:
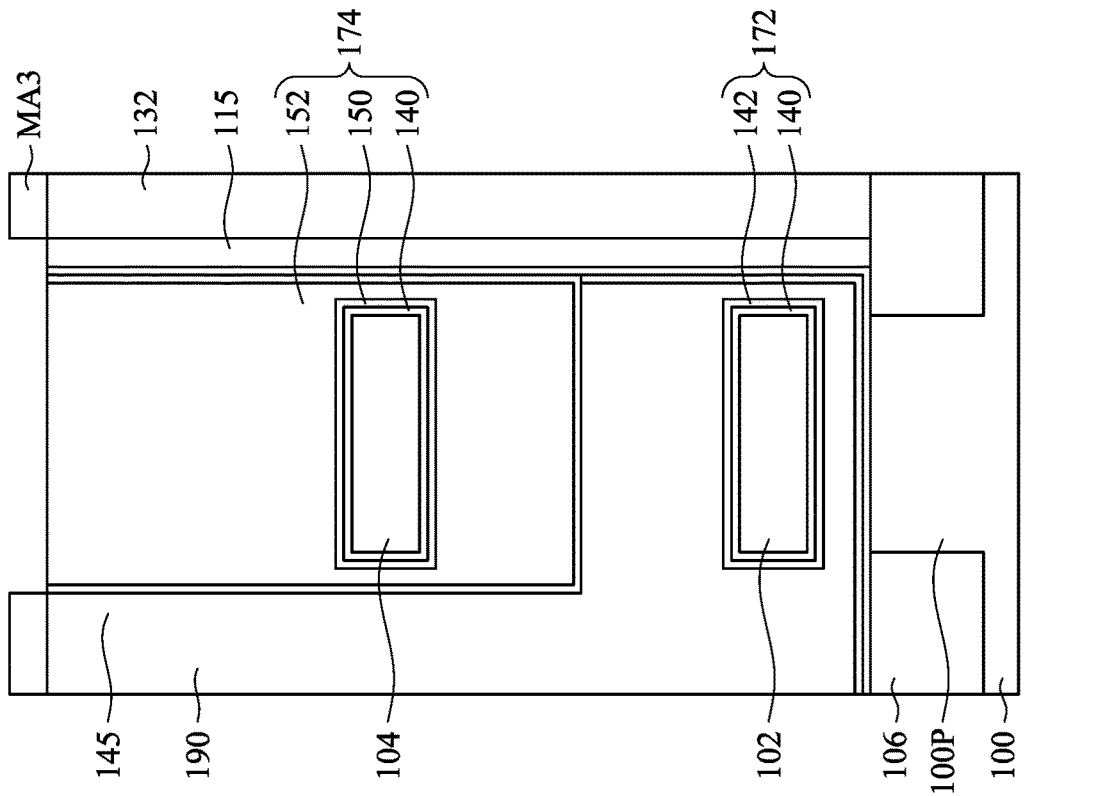

Reference is made to FIGS. 28A to 28C, in which FIG. 28A is a top view of a semiconductor device, FIG. 28B is a cross-sectional view along line A-A of FIG. 28A, and FIG. 28C is a cross-sectional view along line B-B of FIG. 28A. A gate dielectric layer 150 and a gate electrode 152 are sequentially deposited over the substrate 100 and wrapping around the channel region of the second semiconductor layer 104. The gate dielectric layer 150 may be in contact with the portion of the gate dielectric layer 140 wrapping around the second semiconductor layer 104. In some embodiments, portions of the gate dielectric layer 150 may also extend to surfaces of the isolation structure 145. The gate dielectric layer 150 and the gate electrode 152 may be formed using a conformal deposition process, such as ALD, CVD, or the like.

The gate dielectric layer 150 may include an interfacial layer and/or a high-k dielectric. The interfacial layer may include silicon oxide (SiO$_2$). Examples of high-k dielectric material include HfO$_2$, HfSiO, HfSiON, HfTaO, HfTiO, HfZrO, zirconium oxide, aluminum oxide (Al$_2$O$_3$), titanium oxide, hafnium dioxide-alumina (HfO$_2$—Al$_2$O$_3$) alloy, other suitable high-k dielectric materials, and/or combinations thereof. The gate electrode 152 may include titanium-based material or tantalum-based material, such as Ti, TiN, Ta, TaN, or the like. The gate electrode 152 may also include metal, such as tungsten (W), aluminum (Al), copper (Cu), silver (Ag), or the like.

After the gate dielectric layer 150 and the gate electrode 152 are deposited, a first metal gate structure 172 and a second metal gate structure 174 are formed, in which the first metal gate structure 172 wraps around the channel region of the first semiconductor layer 102, and the second metal gate structure 174 wraps around the channel region of the second semiconductor layer 104. In some embodiments, the first metal gate structure 172 may include the gate dielectric layer 140 and the gate electrode 142 over the gate dielectric layer 140. On the other hand, the second metal gate structure 174 may include the gate dielectric layer 140, the gate dielectric layer 150 over the gate dielectric layer 140, and the gate electrode 152 over the gate dielectric layer 150. In some embodiments, the thickness of the gate dielectric of the first metal gate structure 172 (e.g., the gate dielectric layer 140) is less than the thickness of the gate dielectric of the second metal gate structure 174 (e.g., the gate dielectric layers 140 and 150).

The first semiconductor layer 102, the first metal gate structure 172 wrapping around the first semiconductor layer 102, and the first source/drain epitaxy structures 120 on opposite ends of the first semiconductor layer 102 may collective serve as a first transistor (e.g., the first transistor TR1 as discussed in FIGS. 1A to 1D). The second semiconductor layer 104, the second metal gate structure 174 wrapping around the second semiconductor layer 104, and the second source/drain epitaxy structures 130 on opposite ends of the second semiconductor layer 104 may collective serve as a second transistor (e.g., the second transistor TR2 as discussed in FIGS. 1A to 1D). In some embodiments, the second transistor is stacked vertically above the first transistor.

Figure 29B:
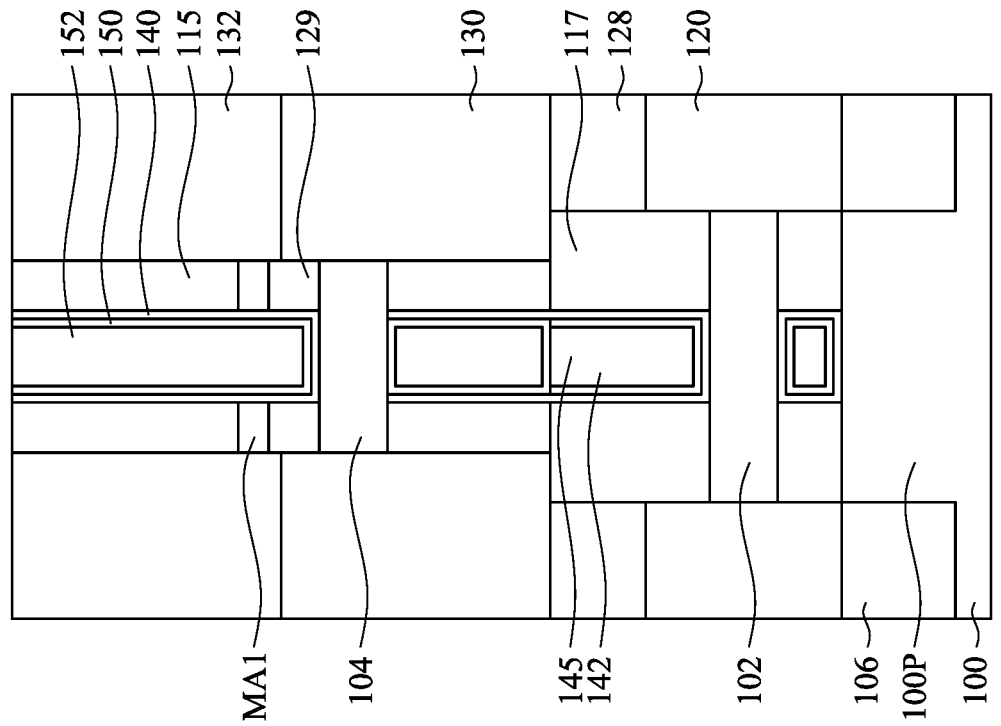
Figure 29A:
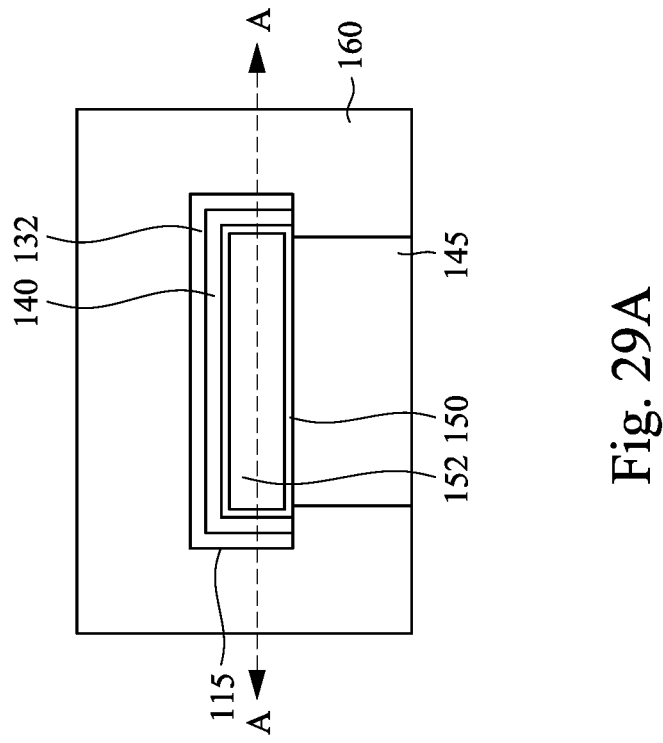

Reference is made to FIGS. 29A and 29B, in which FIG. 29A is a top view of a semiconductor device, and FIG. 29B is a cross-sectional view along line A-A of FIG. 29A. The patterned mask MA3 is removed. As a result, top surfaces of the second metal gate structure 174, the gate spacers 115, and the isolation structures 132 are exposed. In some embodiments, the patterned mask MA3 may be removed using suitable etching process, such as dry etch, wet etch, or the like.

Figure 30B:
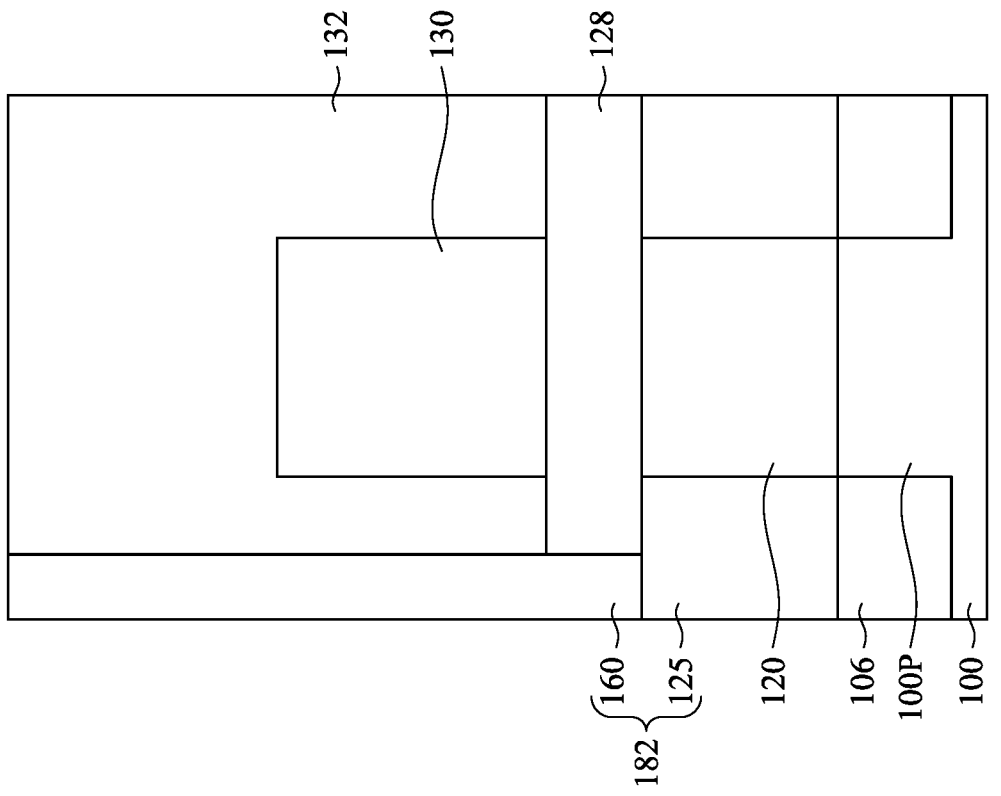
Figure 30A:
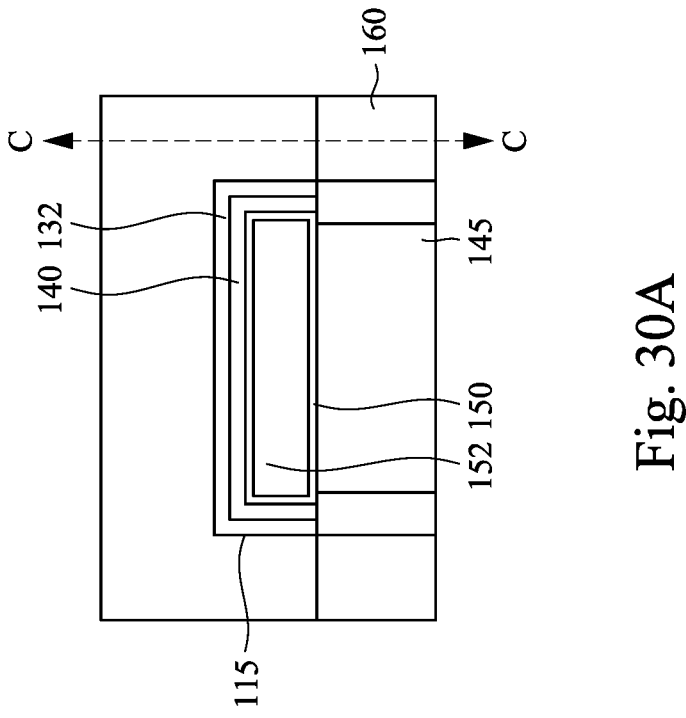

Reference is made to FIGS. 30A and 30B, in which FIG. 30A is a top view of a semiconductor device, and FIG. 30B is a cross-sectional view along line C-C of FIG. 30A. Conductive layers 160 are formed in the isolation structures 132 and in contact with the respective conductive layers 125 below the isolation structures 128 and 132. Each conductive layer 160 and its underlying conductive layer 125 can be collectively referred to as a bottom source/drain contact 182. In some embodiments, the conductive layers 160 may include metal, such as tungsten (W), aluminum (Al), copper (Cu), silver (Ag), or another suitable conductive material(s). The conductive layers 160 and 125 may include a same material. The conductive layers 160 may be formed by, for example, patterning the isolation structures 132 to form openings in the isolation structures 132, filling the openings with conductive material, and then performing a planarization process, such as CMP, to remove excess conductive material until top surface of the second metal gate structure 174 is exposed.

As shown in FIG. 30B, the bottom source/drain contact 182 is in contact with sidewall of the first source/drain epitaxy structure 120, while top surface of the first source/drain epitaxy structure 120 is covered by the isolation structure 128. The bottom source/drain contact 182 is spaced apart from the second source/drain epitaxy structure 130. In some embodiments, the bottom source/drain contact 182 may include an L-shape cross-sectional view. In greater detail, the bottom source/drain contact 182 includes a first portion (e.g., the conductive layer 125) and a second portion (e.g., the conductive layer 160) over the first portion, in which the first portion is wider than the second portion in a lateral direction.

Figure 31B:
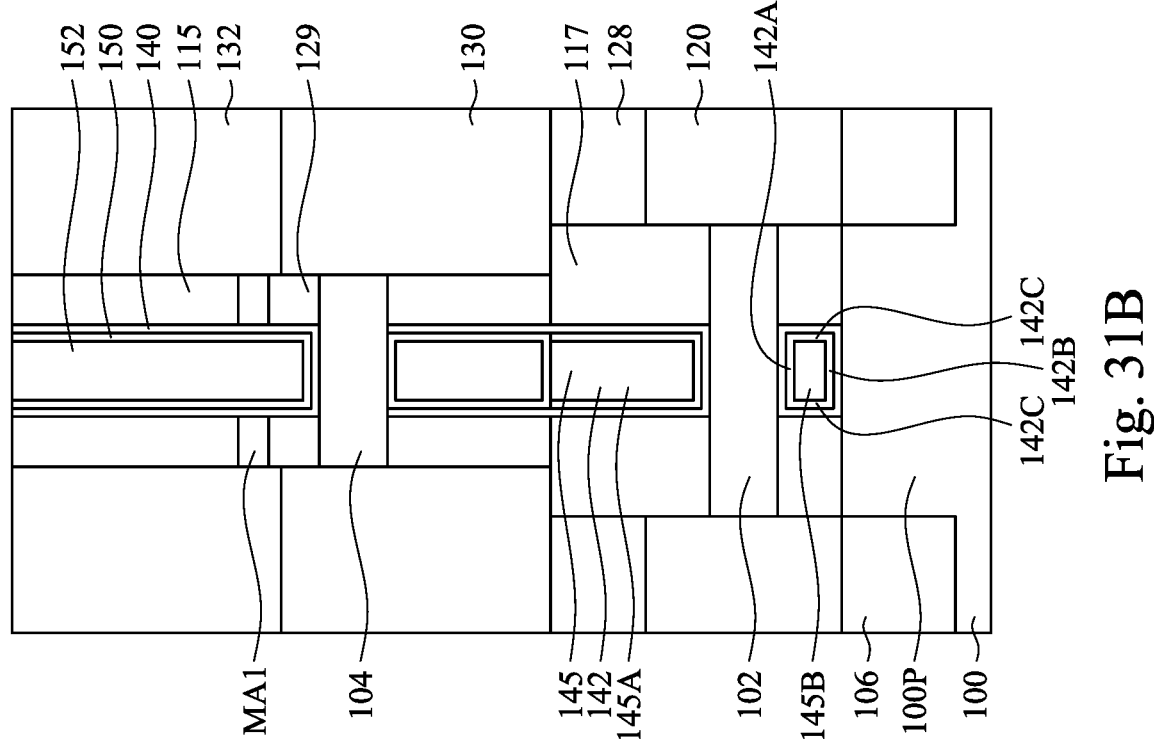
Figure 31A:
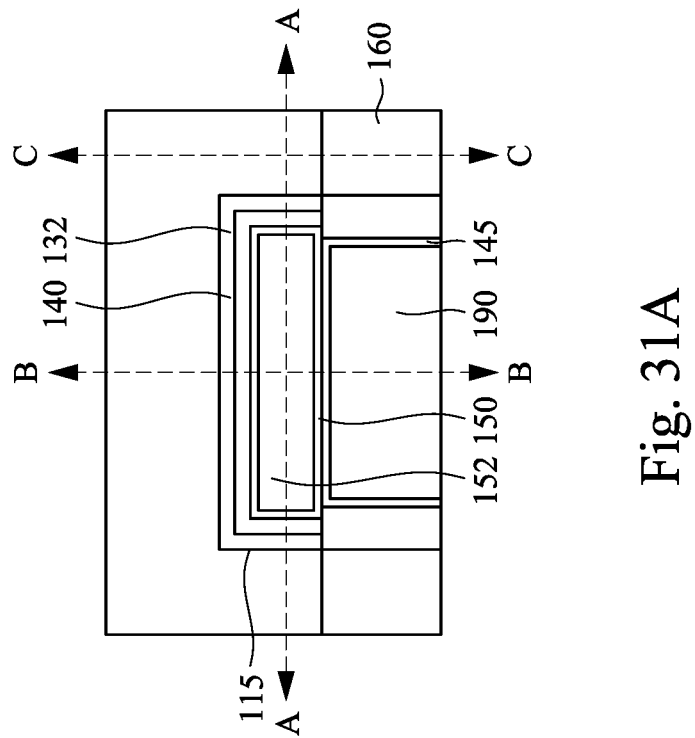
Figures 31C, 31D:
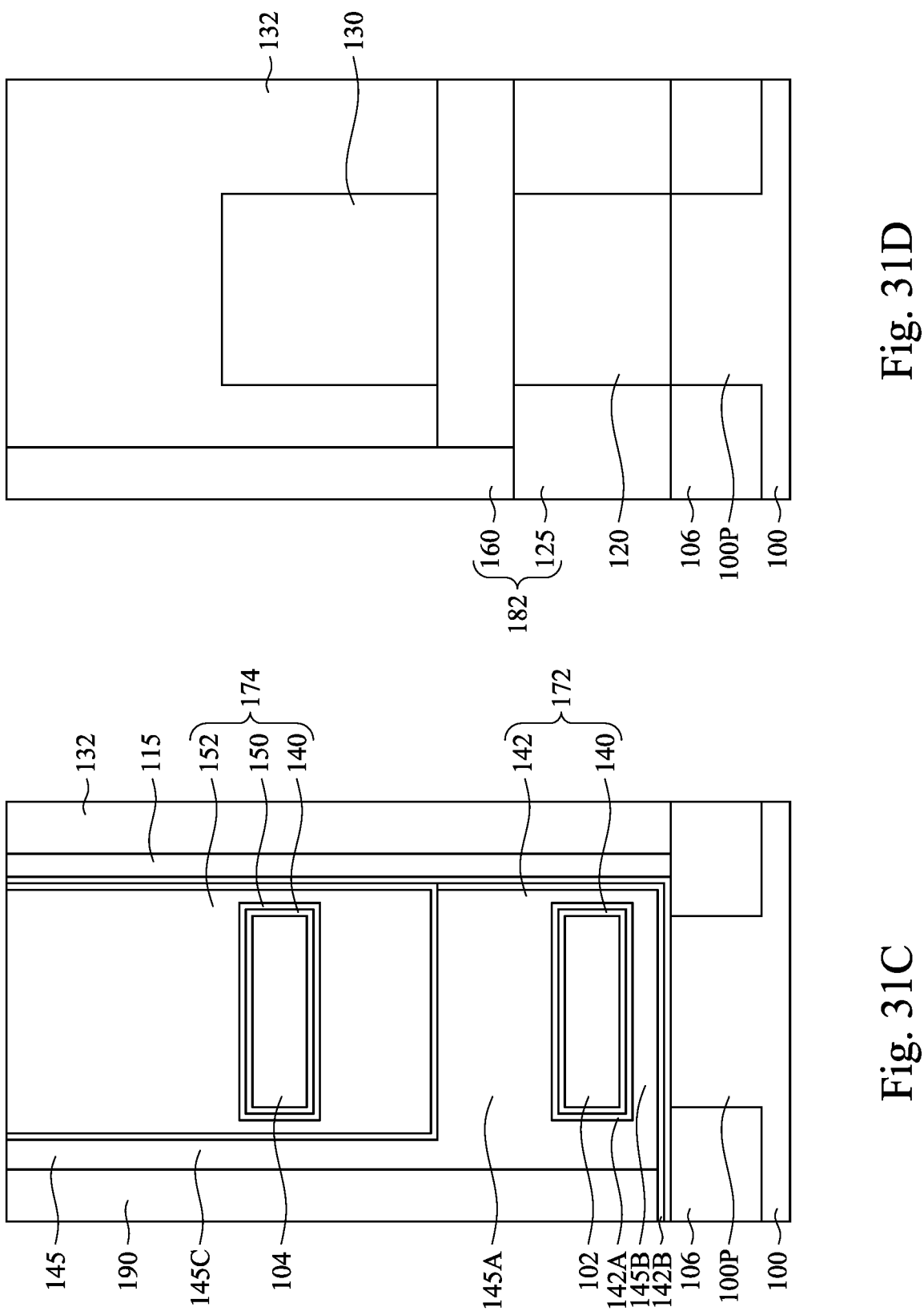

Reference is made to FIGS. 31A to 31D, in which FIG. 31A is a top view of a semiconductor device, FIG. 31B is a cross-sectional view along line A-A of FIG. 31A, FIG. 31C is a cross-sectional view along line B-B of FIG. 31A, and FIG. 31D is a cross-sectional view along line C-C of FIG. 31A. A bottom gate contact 190 is formed in the isolation structure 145 and electrically connected to the first metal gate structure 172. In some embodiments, the bottom gate contact 190 may include metal, such as tungsten (W), aluminum (Al), copper (Cu), silver (Ag), or another suitable conductive material(s). The bottom gate contact 190 may be formed by, for example, patterning the isolation structure 145 to form an opening in the isolation structure 145, filling the openings with conductive material, and then performing a planarization process, such as CMP, to remove excess conductive material until top surface of the second metal gate structure 174 is exposed.

The isolation structure 145 may wrap around the first semiconductor channel layer 102 in the cross-sectional view of FIG. 31C. The isolation structure 145 has a portion 145A vertically between the gate electrode 142 of the first metal gate structure 172 and the gate electrode 152 of the second metal gate structure 174. As shown in FIGS. 31B and 31C, the isolation structure 145 also includes a portion 145B vertically between the first semiconductor channel layer 102 and the semiconductor strip 100P of the substrate 100. As shown in FIG. 31C, the isolation structure 145 also includes a portion 145C in contact with sidewalls of the first metal gate structure 172 and the second metal gate structure 174.

As shown in FIG. 31B, the gate electrode 142 of the first metal gate structure 172 may wrap around the portion 145B of the isolation structure 145. For example, in FIG. 31B, the gate electrode 142 of the first metal gate structure 172 may include a portion 142A in contact with top surface of the portion 145B of the isolation structure 145, a portion 142B in contact with bottom surface of the portion 145B of the isolation structure 145, and two portions 142C that connect the portions 142A and 142B with each other. That is, the portions 142A, 142B, and 142C may form a rectangular ring-shape structure that wraps around the portion 145B of the isolation structure 145 as shown in FIG. 31B.

The bottom gate contact 190 may be in contact with a portion of the gate electrode 142 of the first metal gate structure 172. In greater detail, as shown in FIG. 31C, the portion 142B of the gate electrode 142 may extend to bottom surface of the bottom gate contact 190. Specifically, the portion 142B of the gate electrode 142 is in contact with and is electrically connected to the bottom surface of the bottom gate contact 190. As a result, the portions 142A and 142C of the gate electrode 142 may also be electrically connected to the bottom gate contact 190. In some embodiments, the portion 142B of the gate electrode 142 is also vertically between the bottom gate contact 190 and the isolation structure 106 (or the substrate 100). In some embodiments, the gate dielectric layer 140 has a portion vertically between the portion 142B of the gate electrode 142 and the substrate 100. Moreover, the portion of the gate dielectric layer 140 also extends to a position that is vertically between the bottom surface of the bottom gate contact 190 and the substrate 100.

As shown in FIG. 31C, top surface of the bottom gate contact 190 is substantially level with top surface of the second metal gate structure 174 and top surface of the isolation structure 145. Bottom surface of the bottom gate contact 190 is lower than bottom surface of the second metal gate structure 174, and is substantially level with bottom surface of the isolation structure 145. In some embodiments, the bottom gate contact 190 is laterally separated from the second metal gate structure 174 through the isolation structure 145.

As shown in FIGS. 31C and 31D, the bottom gate contact 190 is vertically separated from the isolation structure 106 through the gate dielectric layer 140 and the gate electrode 142, while the bottom source/drain contact 182 is in contact with the isolation structure 106.

As shown in FIG. 31A, in a top view, the bottom gate contact 190 is separated from the second metal gate structure 174 through the isolation structure 145. That is, the isolation structure 145 is between the bottom gate contact 190 and the second metal gate structure 174 along a first direction. On the other hand, the bottom gate contact 190 and the bottom source/drain contacts 182 are laterally arranged along a second direction perpendicular to the first direction.

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. Embodiments of the present disclosure provide a CFET, which includes a first transistor and a second transistor above the first transistor. The CFET includes a split-gate structure, where an isolation structure is formed electrically isolating a first gate structure of the first transistor from a second gate structure of the second transistor. Such configuration may provide better area reduction, which is beneficial for device scaling down.

In some embodiments of the present disclosure, a semiconductor device includes a first transistor, a second transistor above the first transistor, and an isolation structure. The first transistor includes a first semiconductor channel layer, a first gate structure wrapping around the first semiconductor channel layer, and first source/drain epitaxy structures on opposite ends of the first semiconductor channel layer. The second transistor includes a second semiconductor channel layer, a second gate structure wrapping around the second semiconductor channel layer, and second source/drain epitaxy structures on opposite ends of the second semiconductor channel layer. The isolation structure electrically isolates the first gate structure from the second gate structure, wherein in a top view the isolation structure is adjacent to the second gate structure, and wherein in a first cross-sectional view, the isolation structure wraps around the first semiconductor channel layer.

In some embodiments, a top surface of the isolation structure is substantially level with a top surface of the second gate structure, while a bottom surface of the isolation structure is lower than a bottom surface of the second gate structure.

In some embodiments, the isolation structure has a portion vertically between the first semiconductor channel layer and the substrate, and wherein in a second cross-sectional view perpendicular to the first cross-sectional view, the first gate structure wraps around the portion of the isolation structure.

In some embodiments, in the first cross-sectional view, the isolation structure is in contact with a sidewall and a bottom surface of the second gate structure.

In some embodiments, the semiconductor device further includes a bottom gate contact electrically connected to the first gate structure, wherein the isolation structure is laterally between the bottom gate contact and the second gate structure.

In some embodiments, in the first cross-sectional view, the first gate structure comprises a gate electrode in contact with a bottom surface of the bottom gate contact.

In some embodiments, a top surface of the bottom gate contact is substantially level with a top surface of the second gate structure, while a bottom surface of the bottom gate contact is lower than a bottom surface of the second gate structure.

In some embodiments, the semiconductor device further includes a bottom source/drain contact in contact with one of the first source/drain epitaxy structures, wherein the bottom source/drain contact has an L-shape cross-sectional profile.

In some embodiments of the present disclosure, a semiconductor device includes a first transistor, a second transistor above the first transistor, and a bottom gate contact. The first transistor includes a first semiconductor channel layer, a first gate structure wrapping around the first semiconductor channel layer, and first source/drain epitaxy structures on opposite ends of the first semiconductor channel layer. The second transistor includes a second semiconductor channel layer, a second gate structure wrapping around the second semiconductor channel layer, and second source/drain epitaxy structures on opposite ends of the second semiconductor channel layer. The bottom gate contact is in contact with the first gate structure and spaced apart from the second gate structure, wherein a top surface of the bottom gate contact is higher than a top surface of the first semiconductor channel layer, and a bottom surface of the bottom gate contact is lower than a bottom surface of the first semiconductor channel layer.

In some embodiments, the semiconductor device further includes a shallow trench isolation structure over the substrate, wherein the first gate structure comprise a gate electrode, and the gate electrode has a portion vertically between the bottom gate contact and the shallow trench isolation structure.

In some embodiments, the portion of the gate electrode is in contact with the bottom surface of the bottom gate contact.

In some embodiments, the semiconductor device further includes an isolation structure between the bottom gate contact and the second gate structure, wherein the isolation structure has a first portion vertically between the first gate structure and the second gate structure.

In some embodiments, the isolation structure has a second portion vertically between the first gate structure and the substrate.

In some embodiments, the isolation structure wraps around the first semiconductor channel layer in a cross-sectional view.

In some embodiments, the first gate structure comprises a gate electrode, and the gate electrode has a portion extending from a bottom surface of the isolation structure to the bottom surface of the bottom gate contact.

In some embodiments of the present disclosure, a method includes forming a first semiconductor layer and a second semiconductor layer over a substrate; forming a first gate dielectric layer having a first portion wrapping around the first semiconductor layer and a second portion wrapping around the second semiconductor layer; forming a first gate electrode having a first portion wrapping around the first semiconductor layer and a second portion wrapping around the second semiconductor layer; forming an isolation structure wrapping around the first semiconductor layer and the second semiconductor layer; etching back a portion of the isolation structure to expose the second portion of the first gate electrode; removing the second portion of the first gate electrode; forming a second gate dielectric layer wrapping around the second semiconductor layer; and forming a second gate electrode wrapping around the second semiconductor layer.

In some embodiments, etching back the isolation structure is performed such that the first portion of the first gate electrode remains covered by the etched portion of the isolation structure.

In some embodiments, the second gate dielectric layer is in contact with the second portion of the first gate dielectric layer.

In some embodiments, the method further includes forming a bottom gate contact in the isolation structure, wherein the bottom gate contact is in contact with a third portion of the first gate electrode extending over a shallow trench isolation structure over the substrate.

In some embodiments, the method further includes forming sacrificial layers alternating with the first semiconductor layer and the second semiconductor layer; and removing the sacrificial layers prior to forming the first gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first transistor over a substrate, comprising:
a first semiconductor channel layer;

a first gate structure wrapping around the first semiconductor channel layer; and first source/drain epitaxy structures on opposite ends of the first semiconductor channel layer;

a second transistor vertically above the first transistor, comprising:

a second semiconductor channel layer;

a second gate structure wrapping around the second semiconductor channel layer; and second source/drain epitaxy structures on opposite ends of the second semiconductor channel layer; and an isolation structure electrically isolating the first gate structure from the second gate structure, wherein in a top view the isolation structure is adjacent to the second gate structure, and wherein in a first cross-sectional view, the isolation structure wraps around the first semiconductor channel layer.

2. The semiconductor device of claim 1, wherein a top surface of the isolation structure is substantially level with a top surface of the second gate structure, while a bottom surface of the isolation structure is lower than a bottom surface of the second gate structure.

3. The semiconductor device of claim 1, wherein the isolation structure has a portion vertically between the first semiconductor channel layer and the substrate, and wherein in a second cross-sectional view perpendicular to the first cross-sectional view, the first gate structure wraps around the portion of the isolation structure.

4. The semiconductor device of claim 1, wherein in the first cross-sectional view, the isolation structure is in contact with a sidewall and a bottom surface of the second gate structure.

5. The semiconductor device of claim 1, further comprising a bottom gate contact electrically connected to the first gate structure, wherein the isolation structure is laterally between the bottom gate contact and the second gate structure.

6. The semiconductor device of claim 5, wherein in the first cross-sectional view, the first gate structure comprises a gate electrode in contact with a bottom surface of the bottom gate contact.

7. The semiconductor device of claim 5, wherein a top surface of the bottom gate contact is substantially level with a top surface of the second gate structure, and a bottom surface of the bottom gate contact is lower than a bottom surface of the second gate structure.

8. The semiconductor device of claim 1, further comprising a bottom source/drain contact in contact with one of the first source/drain epitaxy structures, wherein the bottom source/drain contact has an L-shape cross-sectional profile.

9. A semiconductor device, comprising:

a first transistor over a substrate, comprising:

a first semiconductor channel layer;

a first gate structure wrapping around the first semiconductor channel layer; and first source/drain epitaxy structures on opposite ends of the first semiconductor channel layer;

a second transistor vertically above the first transistor, comprising:

a second semiconductor channel layer;

a second gate structure wrapping around the second semiconductor channel layer; and second source/drain epitaxy structures on opposite ends of the second semiconductor channel layer; and a bottom gate contact in contact with the first gate structure and spaced apart from the second gate structure, wherein a top surface of the bottom gate contact is higher than a top surface of the first semiconductor channel layer, and a bottom surface of the bottom gate contact is lower than a bottom surface of the first semiconductor channel layer.

10. The semiconductor device of claim 9, further comprising a shallow trench isolation structure over the substrate, wherein the first gate structure comprise a gate electrode, and the gate electrode has a portion vertically between the bottom gate contact and the shallow trench isolation structure.

11. The semiconductor device of claim 10, wherein the portion of the gate electrode is in contact with the bottom surface of the bottom gate contact.

12. The semiconductor device of claim 9, further comprising an isolation structure between the bottom gate contact and the second gate structure, wherein the isolation structure has a first portion vertically between the first gate structure and the second gate structure.

13. The semiconductor device of claim 12, wherein the isolation structure has a second portion vertically between the first gate structure and the substrate.

14. The semiconductor device of claim 12, wherein the isolation structure wraps around the first semiconductor channel layer in a cross-sectional view.

15. The semiconductor device of claim 12, wherein the first gate structure comprises a gate electrode, and the gate electrode has a portion extending from a bottom surface of the isolation structure to the bottom surface of the bottom gate contact.

16. A method, comprising:

forming a first semiconductor layer and a second semiconductor layer over a substrate;

forming a first gate dielectric layer having a first portion wrapping around the first semiconductor layer and a second portion wrapping around the second semiconductor layer;

forming a first gate electrode having a first portion wrapping around the first semiconductor layer and a second portion wrapping around the second semiconductor layer;

forming an isolation structure wrapping around the first semiconductor layer and the second semiconductor layer;

etching back a portion of the isolation structure to expose the second portion of the first gate electrode;

removing the second portion of the first gate electrode;

forming a second gate dielectric layer wrapping around the second semiconductor layer; and forming a second gate electrode wrapping around the second semiconductor layer.

17. The method of claim 16, wherein etching back the isolation structure is performed such that the first portion of the first gate electrode remains covered by the etched portion of the isolation structure.

18. The method of claim 16, wherein the second gate dielectric layer is in contact with the second portion of the first gate dielectric layer.

19. The method of claim 16, further comprising forming a bottom gate contact in the isolation structure, wherein the bottom gate contact is in contact with a third portion of the first gate electrode extending over a shallow trench isolation structure over the substrate.

20. The method of claim 16, further comprising:

forming sacrificial layers alternating with the first semiconductor layer and the second semiconductor layer; and removing the sacrificial layers prior to forming the first
  gate dielectric layer.

\*  \*  \*  \*  \*